United States Patent
Na et al.

(10) Patent No.: US 11,655,935 B2
(45) Date of Patent: May 23, 2023

(54) DISPLAY DEVICE

(71) Applicant: LG ELECTRONICS INC., Seoul (KR)

(72) Inventors: Seokhun Na, Seoul (KR); Kwangho Choi, Seoul (KR); Jaehun Lee, Seoul (KR); Jaewoo Cho, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 198 days.

(21) Appl. No.: 17/156,067

(22) Filed: Jan. 22, 2021

(65) Prior Publication Data

US 2021/0356074 A1    Nov. 18, 2021

(30) Foreign Application Priority Data

May 14, 2020    (WO) ................ PCT/KR2020/006372

(51) Int. Cl.
*F16M 13/02*     (2006.01)
*F16B 1/00*      (2006.01)
(Continued)

(52) U.S. Cl.
CPC ............... *F16M 13/02* (2013.01); *F16B 1/00* (2013.01); *H05K 5/0017* (2013.01);
(Continued)

(58) Field of Classification Search
None
See application file for complete search history.

(56) References Cited

U.S. PATENT DOCUMENTS 6,728,109 B1 *   4/2004   Wu ..................... G06F 1/181
                                              361/755
8,757,568 B2 *   6/2014   Ko ..................... F16M 13/02
                                              248/223.41
(Continued)

FOREIGN PATENT DOCUMENTS

KR    100743746    7/2007
KR    100968455    7/2010
(Continued)

OTHER PUBLICATIONS

PCT International Application No. PCT/KR2020/006372, International Search Report dated Feb. 9, 2021, 3 pages.

*Primary Examiner* — Xanthia C Cunningham
(74) *Attorney, Agent, or Firm* — Lee, Hong, Degerman, Kang & Waimey PC

(57) ABSTRACT

A display device is disclosed. The display device includes a display panel, a back cover covering a rear surface of the display panel, a bracket coupled to a rear surface of the back cover, and a support removably coupled to the bracket, wherein the bracket includes a first plate, a second plate facing the first plate, and a link connecting the first plate to the second plate, wherein the second plate includes therein a slot, which is formed toward an inside from a lower side of the second plate and in which the support is movably received, wherein the link includes a lower link, and an upper link disposed above the lower link, and wherein each of the lower link and the upper link extends in a direction intersecting the first plate and the second plate, and is pivotably coupled both to the first plate and to the second plate.

15 Claims, 28 Drawing Sheets

(51) Int. Cl.
*H05K 5/02* (2006.01)
*H05K 5/00* (2006.01)

(52) U.S. Cl.
CPC .... *H05K 5/0204* (2013.01); *F16B 2001/0035* (2013.01); *F16M 2200/063* (2013.01)

(56) References Cited

U.S. PATENT DOCUMENTS

| | | | | |
|---|---|---|---|---|
| 9,060,426 | B2* | 6/2015 | Mo | G11B 33/128 |
| 9,095,042 | B2* | 7/2015 | Hong | H05K 7/00 |
| 9,637,963 | B1* | 5/2017 | Heichel | E05D 15/26 |
| 10,738,934 | B2* | 8/2020 | Ahn | F16M 13/02 |
| 11,153,984 | B1* | 10/2021 | Chen | G06F 1/1616 |
| 2009/0103997 | A1* | 4/2009 | Csik | F16B 37/045 |
| | | | | 411/112 |
| 2009/0225506 | A1* | 9/2009 | Lee | G09F 9/33 |
| | | | | 29/469 |
| 2009/0278006 | A1* | 11/2009 | Park | F16M 11/10 |
| | | | | 248/302 |
| 2010/0102180 | A1* | 4/2010 | Liu | F16M 11/16 |
| | | | | 248/176.1 |
| 2010/0176261 | A1* | 7/2010 | Chen | F16M 13/02 |
| | | | | 248/231.91 |
| 2011/0084892 | A1* | 4/2011 | Han | G06F 1/1601 |
| | | | | 345/1.3 |
| 2011/0147546 | A1 | 6/2011 | Monsalve et al. | |
| 2021/0267078 | A1* | 8/2021 | Wang | F16M 13/02 |

FOREIGN PATENT DOCUMENTS

| | | |
|---|---|---|
| KR | 102034585 | 10/2019 |
| KR | 102072686 | 2/2020 |

* cited by examiner

DISPLAY DEVICE

CROSS-REFERENCE TO RELATED APPLICATION

Pursuant to 35 U.S.C. § 119, this application claims the benefit of an earlier filing date and right of priority to International Application No. PCT/KR2020/006372, filed on May 14, 2020, the contents of which are hereby incorporated by reference herein in its entirety.

BACKGROUND OF THE INVENTION

1. Field of the Invention

The present disclosure relates to a display device, and more particularly to a display device, which is configured to be installed on a stationary object, such as a wall, by means of a bracket.

2. Description of the Related Art

With the development of the information society, demand for various kinds of display devices is increasing. In response to these needs, various kinds of display devices, such as LCDs (Liquid Crystal Display Devices), PDPs (Plasma Display Panels), ELDs (Electro luminescent Displays), VFDs (Vacuum Fluorescent Displays) and OLEDs (Organic Light-Emitting Diodes), have been recently researched and used.

Among these, an LCD panel includes a TFT substrate and a color substrate, which face each other with a liquid crystal layer interposed therebetween, in order to display an image using light supplied from a backlight unit. Meanwhile, an OLED panel is configured to display an image by depositing a self-luminescent organic layer on a substrate having a transparent electrode formed thereon.

In order to follow recent trends in the development and marketing of display devices, research on a display device that is configured to be installed on a wall has been intensively conducted.

SUMMARY OF THE INVENTION

It is an object of the present disclosure to solve the above and other problems.

It is another object of the present disclosure to provide a display device, which is capable of being installed on a stationary object, such as a wall, by means of a bracket coupled to a back cover of the display device and a support fixed to the stationary object.

It is another object of the present disclosure to provide a display device, in which a first plate of a bracket is capable of being tilted with respect to a second plate of the bracket, thereby allowing a user to easily access the rear side of a back cover of the display device.

It is another object of the present disclosure to provide a display device, in which a first plate of a bracket is constructed so as to surround a second plate of the bracket and to be parallel to the second plate, thereby minimizing the distance between a back cover of the display device and a stationary object.

In accordance with an aspect of the present disclosure, the above and other objects can be accomplished by the provision of a bracket including a first plate, a second plate disposed so as to face the first plate, and a link disposed between the first plate and the second plate so as to connect the first plate to the second plate, wherein the second plate includes therein a slot, which is formed toward an inside from a lower side of the second plate, wherein the link includes a lower link, and an upper link disposed above the lower link, and wherein each of the lower link and the upper link extends in a direction intersecting the first plate and the second plate, and is pivotably coupled both to the first plate and to the second plate.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

A description will now be given in detail according to exemplary embodiments disclosed herein, with reference to the accompanying drawings. For the sake of brevity of description with reference to the drawings, the same or equivalent components is denoted by the same reference numbers, and a description thereof will not be repeated.

In general, suffixes such as "module" and "unit" may be used to refer to elements or components. The use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features, and it should be understood that the embodiments presented herein are not limited by the accompanying drawings. As such, the present disclosure should be construed to extend to any alterations, equivalents and substitutes, in addition to those which are particularly set out in the accompanying drawings.

It will be understood that although the terms "first," "second," etc. may be used herein to describe various elements, these elements should not be limited by these terms. These terms are only used to distinguish one element from another.

It will be understood that when an element is referred to as being "connected with" another element, intervening elements may be present. In contrast, it will be understood that when an element is referred to as being "directly connected with" another element, there are no intervening elements present.

A singular representation may include a plural representation unless the context clearly indicates otherwise.

In the present application, it should be understood that the terms "comprises," "includes," "has," etc. specify the presence of features, numbers, steps, operations, elements, components, or combinations thereof described in the specification, but do not preclude the presence or addition of one or more other features, numbers, steps, operations, elements, components, or combinations thereof.

Figure 1:
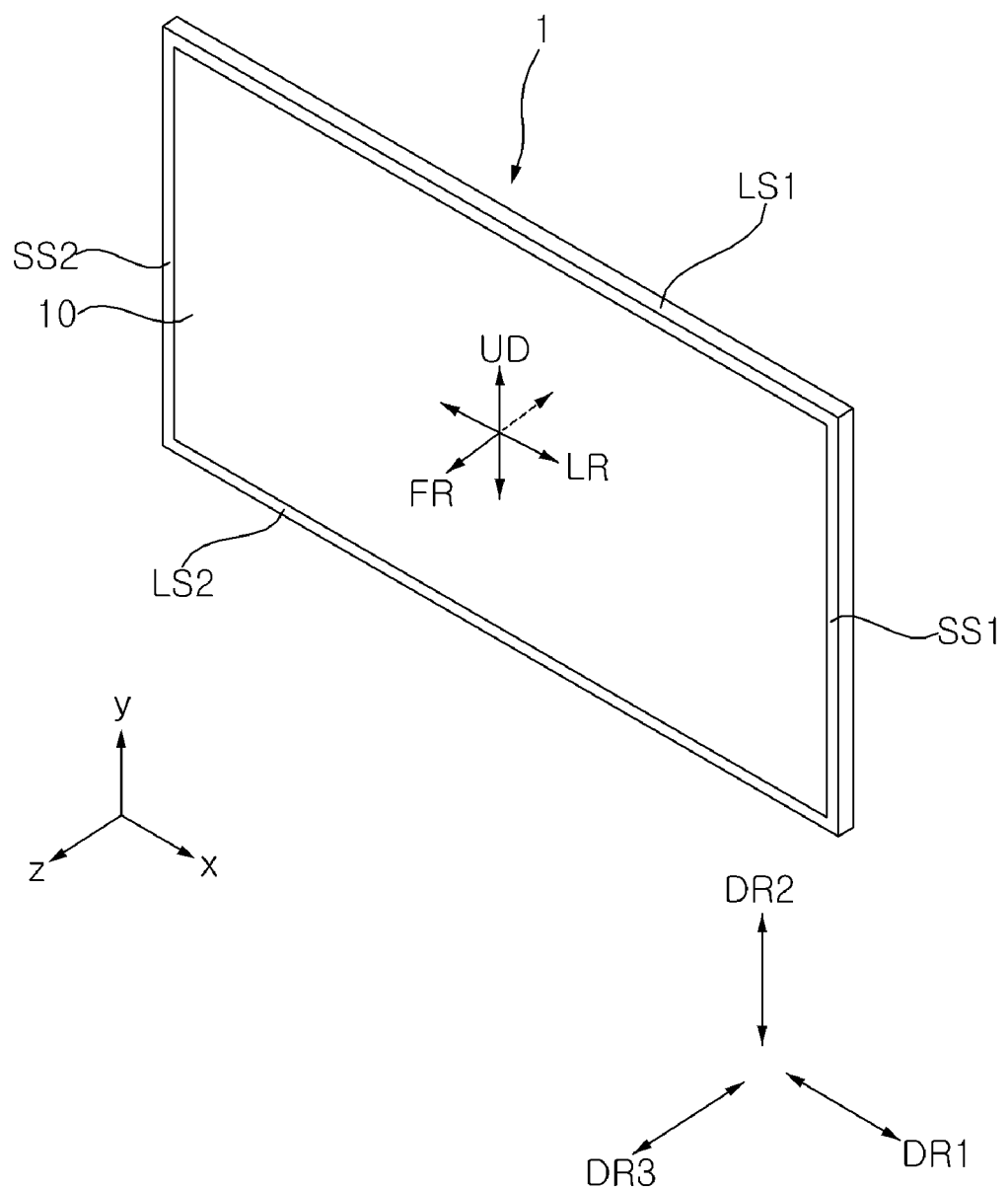
FIGS. 1 to 28 are views illustrating display devices according to embodiments of the present disclosure.

Referring to FIG. 1, the display device 1 may include a display panel 10. The display panel 10 may display a screen.

The display device 1 may include a first long side LS1, a second long side LS2, which faces the first long side LS1, a first short side SS1 adjacent to the first long side LS1 and the second long side LS2, and a second short side SS2, which faces the first short side SS1. Although each of the first and second long sides LS1 and LS2 is illustrated and described as being longer than each of the first and second short sides SS1 and SS2 for the convenience of explanation, the length of each of the first and second long sides LS1 and LS2 may be almost the same as that of each of the first and second short sides SS1 and SS2.

A direction, which is parallel to the first and second long sides LS1 and LS2 of the display device 1, may be referred to as a first direction DR1 or a left and right direction LR. A direction, which is parallel to the first and second short sides SS1 and SS2 of the display device 1, may be referred to as a second direction DR2 or a up and down direction UD. A direction perpendicular to the first and second long sides LS1 and LS2 and the first and second short sides SS1 and SS2, may be referred to as a third direction DR3 or a front and rear direction FR. Here, the direction in which the display panel 10 displays an image may be referred to as a forward direction, and the direction opposite the forward direction may be referred to as a rearward direction.

Hereinafter, the display device 1 including the display panel 10 as an LCD panel will be described as one example with reference to FIGS. 2 to 4, and a display device 1' including a display panel 10' as an OLED panel will be described as another example with reference to FIG. 5. The display devices to which the present disclosure is applicable are not limited thereto.

Figure 2:
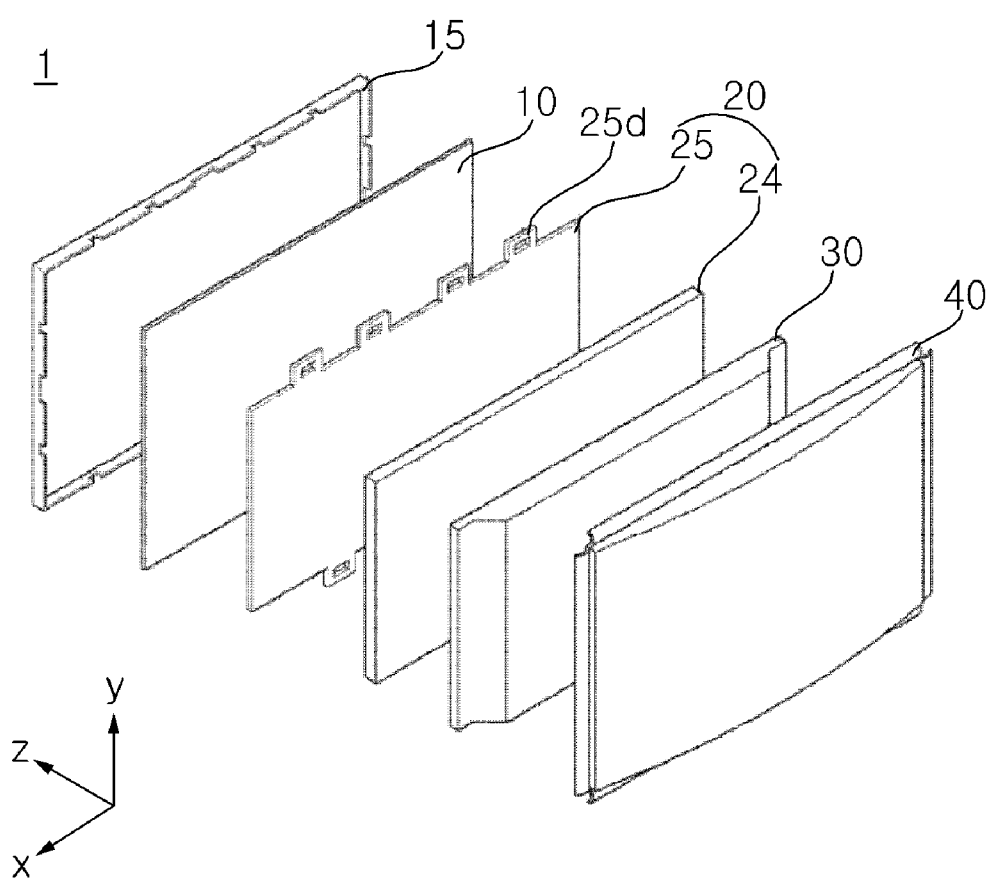

Referring to FIG. 2, the display device 1 may include the display panel 10, a front cover 15, a backlight unit 20, a module cover 30 and a back cover 40. Here, the display panel 10 may be referred to as an LCD panel.

The front cover 15 may cover at least a portion of the front surface and the lateral side surface of the display panel 10. The front cover 15 may be divided into a front cover, positioned at the front face of the display panel 10, and a side cover, positioned at the lateral side surface of the display panel 10. The front cover and the side cover may be constructed separately. One of the front cover and the side cover may be omitted.

The display panel 10 is provided on the front face of the display device 1 so as to display an image. The display panel 10 may display an image by outputting red, green or blue of each of a plurality of pixels on time. The display panel 10 may be divided into an active area, in which an image is displayed, and a inactive area, in which an image is not displayed. The display panel 10 may include a front substrate and a rear substrate, which face each other with a liquid crystal layer interposed therebetween.

The front substrate may include a plurality of pixels, each of which is composed of red, green and blue sub-pixels. The front substrate may output light corresponding to red, green or blue in response to a control signal.

The rear substrate may include switching devices. The rear substrate may switch a pixel electrode. For example, the pixel electrode may change the molecular arrangement of the liquid crystal layer in response to a control signal. The liquid crystal layer may include liquid crystal molecules. The arrangement of the liquid crystal molecules may be changed according to the voltage difference between the pixel electrode and the common electrode. The liquid crystal layer may transmit light, supplied from the backlight unit 20, to the front substrate, or may obstruct the transmission of light.

The backlight unit 20 may be positioned behind the display panel 10. The backlight unit 20 may include light sources. The backlight unit 20 may be coupled to the module cover 20 in the front of the module cover 30. The backlight unit 20 may be driven in an overall driving manner or in a local manner, such as local dimming driving or impuls driving. The backlight unit 20 may include an optical sheet 25 and an optical layer 24.

The optical sheet 25 may enable the light from the light sources to be uniformly transmitted to the display panel 10. The optical sheet 25 may be composed of a plurality of layers. For example, the optical sheet 25 may include a prism sheet, a diffusion sheet and the like.

The optical sheet 25 may include couplers 25d. The couplers 25d may be coupled to the front cover 15, the module cover 30 and/or the back cover 40. The couplers 25d may be coupled to a structural object formed on or coupled to the front cover 15, the module cover 30 and/or the back cover 40.

The module cover 30 may be positioned behind the display panel 10 so as to support the components of the display device 1. For example, the components, such as the backlight unit 20, and a printed circuit board (PCB) at which a plurality of electronic components are positioned, may be coupled to the module cover 30. The module cover 30 may include a metal material such as an aluminum alloy.

The back cover 40 may be positioned behind the display device 1. The back cover 40 may cover the rear surface of the display panel 10. The back cover 40 may be coupled to the module cover 30 and/or the front cover 15. For example, the back cover 40 may be injection-molded from resin. However, the back cover 40 may also include a metal material.

Figure 3:
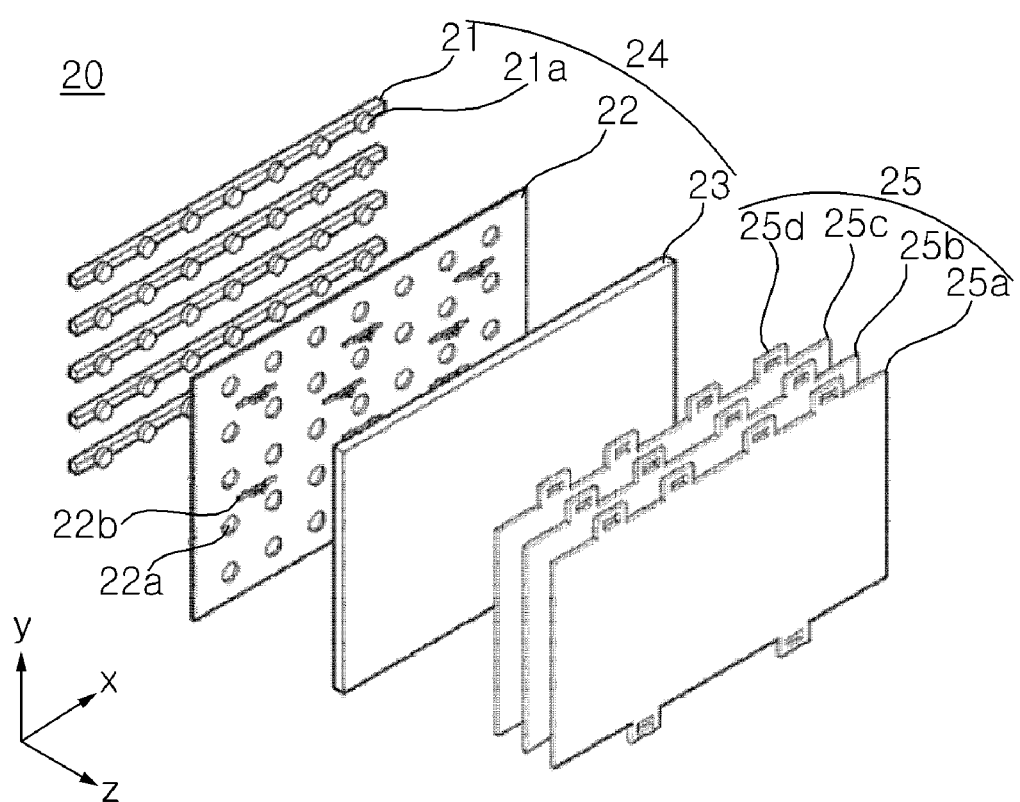

Referring to FIG. 3, the backlight unit 20 may include the optical layer 24, which is composed of a substrate 21, at least one light assembly 21a, a reflective sheet 22 and a diffusion plate 23, and the optical sheet 25 positioned in front of the optical layer 24.

The substrate 21 may be composed of a plurality of straps, which extend in a lateral direction and are spaced apart from each other in a vertical direction. At least one light assembly 21a may be mounted on the substrate 21. An electrode pattern may be formed on the substrate 21 so as to allow an adapter and the light assembly 21a to be connected to the substrate 21. For example, a carbon nanotube electrode pattern may be formed on the substrate 21 so as to allow the light assembly 21a and an adapter to be connected to the substrate 21.

The substrate 21 may be composed of at least one of polyethylene terephthalate (PET), polycarbonate (PC) and silicon. The substrate 21 may be a printed circuit board (PCB), on which at least one light assembly 21a is mounted.

The light assembly 21a may be a light-emitting diode (LED) chip or a light-emitting diode package including at least one light-emitting diode chip. The light assembly 21a may be composed of a colored LED configured to emit at least one color among red, green and blue or a white color LED. The colored LED may include at least one of a red LED, a green LED and a blue LED.

The reflective sheet 22 may be positioned ahead of the substrate 21. The reflective sheet 22 may have a plurality of through holes 22a in which the light assemblies 21a are positioned. The reflective sheet 22 may reflect the light, which is emitted from the light assemblies 21a or is reflected at the diffusion plate 23, forwards. For example, the reflective sheet 22 may include metal and/or metal oxide having high reflectance, such as aluminum (Al), silver (Ag), gold (Au) or titanium dioxide ($TiO_2$).

An air gap may be formed between the reflective sheet 22 and the diffusion plate 23. The air gap may serve as a buffer configured to widely diffuse the light emitted from the light assemblies 21a. In order to form the air gap, supports 22b may be positioned between the reflective sheet 22 and the diffusion plate 23.

The diffusion plate 23 may be positioned ahead of the reflective sheet 22. The diffusion plate 23 may be positioned between the reflective sheet 22 and the optical sheet 25.

The optical sheet 25 may include at least one sheet. Specifically, the optical sheet 25 may include at least one prism sheet and/or at least one diffusion sheet. The plurality of sheets included in the optical sheet 25 may be adhere and/or in close contact with each other.

The optical sheet 25 may be composed of sheets having different functions. For example, the optical sheet 25 may include a first optical sheet 25a, a second optical sheet 25b and a third optical sheet 25c. For example, the first optical sheet 25a may be a diffusion sheet, and each of the second and third optical sheets 25b and 25c may be a prism sheet. The number and/or positions of the diffusion sheet and the prism sheets may be changed. The diffusion sheet may prevent the light that is emitted from the diffusion plate 23 from being locally concentrated, thereby offering uniform distribution of light. The prism sheets may collect the light emitted from the diffusion plate 23 and transmit the light to the display panel 10.

Figure 4:
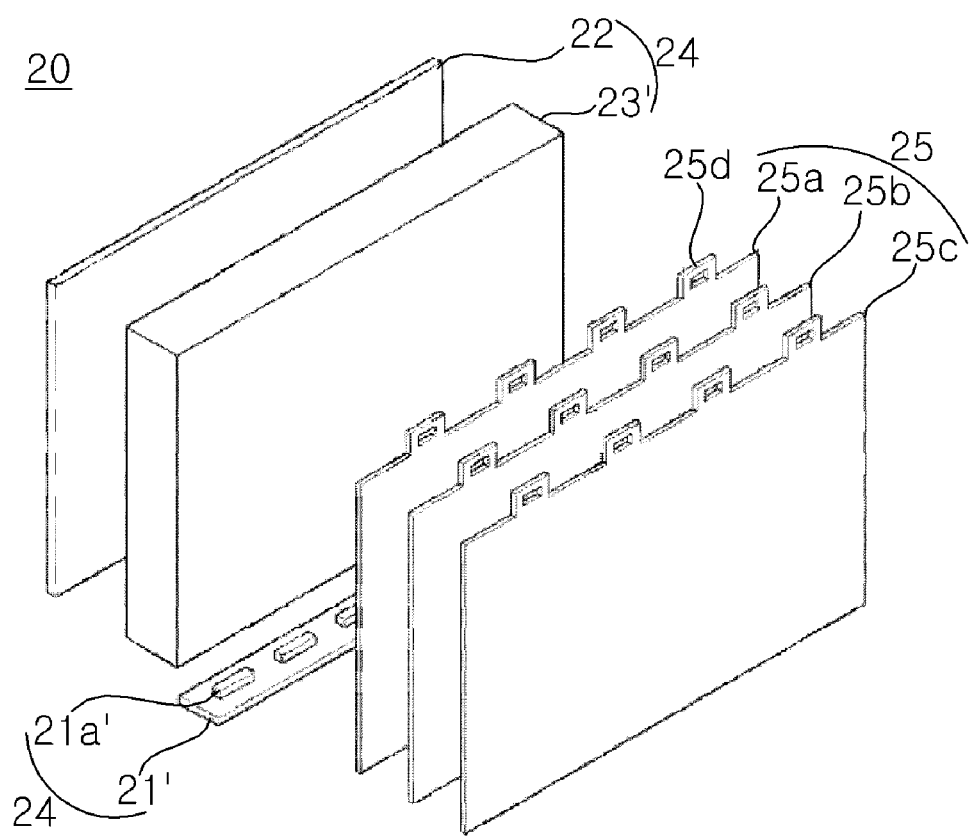

Referring to FIG. 4, the light source of the backlight unit 20 may be disposed at the edge of the backlight unit 20. The backlight unit 20 may include the optical layer 24, which is composed of a substrate 21', at least one light assembly 21a', the reflective sheet 22, and a light guide plate 23', and the optical sheet 25 positioned ahead of the optical layer 24.

The substrate 21' may extend in a lateral direction, and may be positioned adjacent to the lower side of the light guide plate 23'. The at least one light assembly 21a' may be mounted on the substrate 21'. Consequently, most of the light emitted from the light assembly 21a' may be transmitted to the inside of the light guide plate 23'. Here, the light guide plate 23' may reflect the incident light from the light assembly 21a' forwards. The diffusion plate 23 (not shown in FIG. 4) may also be provided on the front surface of the light guide plate 23'.

The reflective sheet 22 may be positioned behind the light guide plate 23'. The reflective sheet 22 may reflect the light, which is emitted from the light assembly 21a' or is reflected at the light guide plate 23', forwards.

Figure 5:
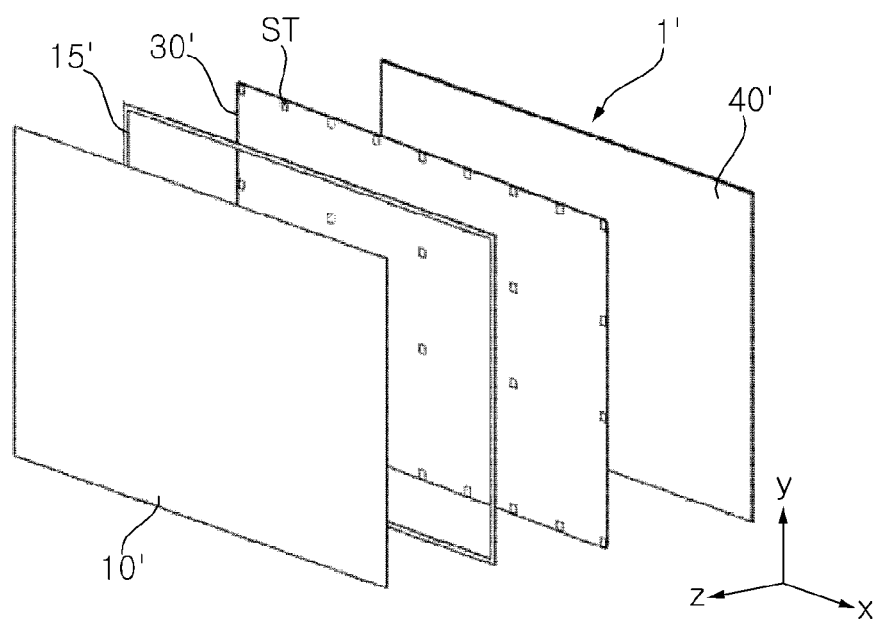

Referring to FIG. 5, a display device 1' may include a display panel 10', a middle frame 15', a module cover 30' and a back cover 40', unlike the previous embodiments. Here, the display device 1' may be referred to as an OLED panel. The display device 1' is advantageous in that the display device 1' is capable of being formed extremely slim because there is no need for a backlight unit.

The display panel 10' may define the front surface of the display device 1', and may display an image on the front surface of the display device 1'. The display panel 10' may divide an image into a plurality of pixels, and may control the color, brightness and chroma of each of the pixels, thereby outputting the image. The display panel 10' may be divided into an active area, in which an image is displayed, and a inactive area, in which an image is not displayed. The display panel 10' may generate light corresponding to red, green or blue in response to a control signal.

The middle frame 15' may define the lateral side surface of the display device 1'. The middle frame 15' may be positioned behind the display panel 10', and the display panel 10' may be coupled to the middle frame 15'. The middle frame 15' may be configured to have a rectangular frame shape overall. For example, the middle frame 15' may include a metal material. Accordingly, the middle frame 15' may increase the torsional and/or bending rigidity of the display device 1'.

The module cover 30' may be coupled to the middle frame 15' from the rear side of the middle frame 15'. A printed circuit board (PCB), on which a plurality of electronic components are positioned, may be coupled to the module cover 30'.

The back cover 40' may be coupled to the module cover 30' from the rear side of the module cover 30'. The back cover 40' may define the rear surface of the display device 1'. For example, the back cover 40' may be injection-molded from a resin material. However, the back cover 40' may also include a metal material.

Figure 6:
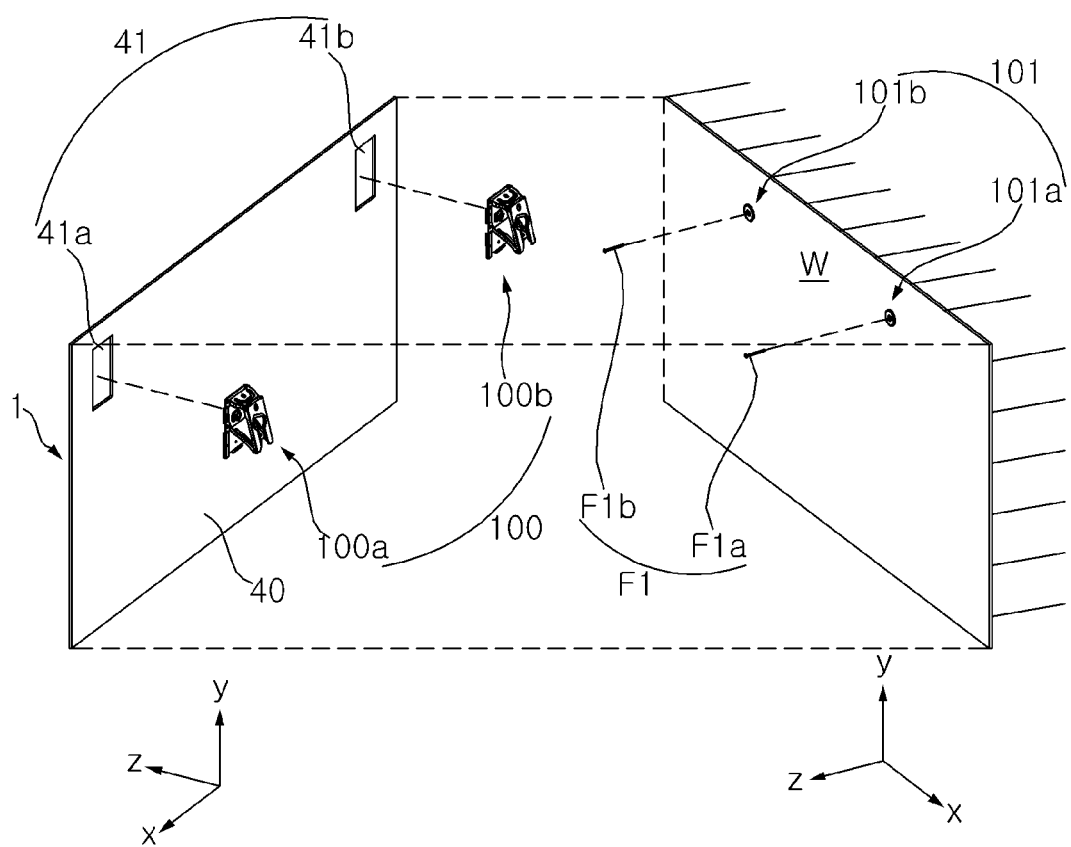

Referring to FIG. 6, the display device 1 may be installed on a stationary object W, such as a wall, via a bracket 100, which is coupled to the back cover 40, and a support 101, which is fixed to the stationary object W. Here, the bracket 100 may be referred to as a mount. The bracket 100 may also be referred to as a pin, a holder or a spacer.

Specifically, the bracket 100 may be fixed to a mounting portion 41 of the back cover 40 by means of a fastening element (not shown) such as a screw. The support 101 may be fixed to the stationary object W by means of a fastening element F1 such as a nail or a screw. Here, the bracket 100 may come close to the support 101 so as to be coupled to the support 101, or may be moved away from the support 101 so as to be separated from the support 101. This will be described in more detail later.

Figure 7:
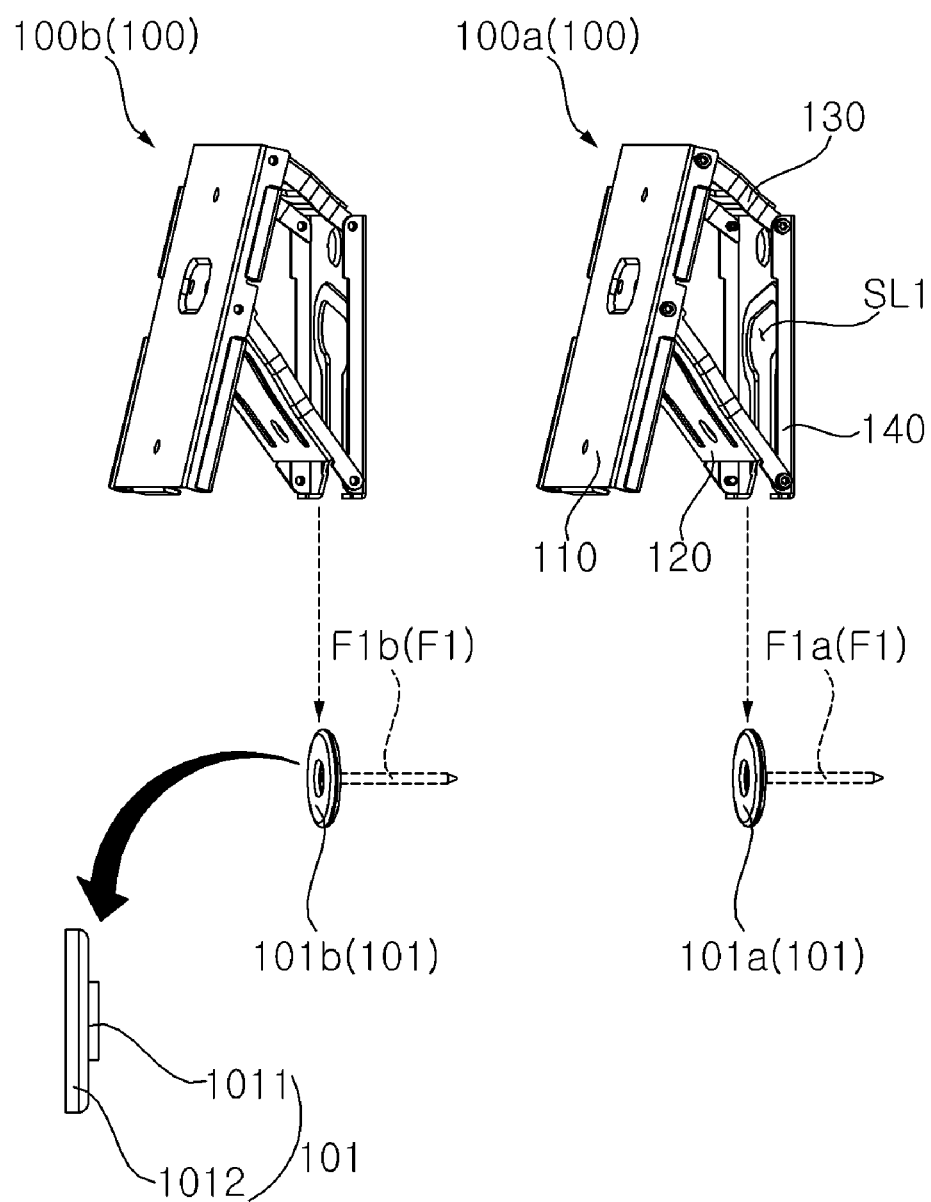

Referring to FIGS. 6 and 7, the bracket 100 may include a first plate 110, links 120 and 130, and a second plate 140.

The first plate 110 may be fixed to the mounting portion 41 of the back cover 40. The links 120 and 130 may be positioned behind the first plate 110, and may be coupled at first ends thereof to the first plate 110. The second plate 140 may be positioned behind the first plate 110, and the links 120 and 130 may be coupled at second ends thereof to the second plate 140. In other words, the second plate 140 may face the first plate 110, with the links 120 and 130 interposed therebetween.

The support 101 may include a neck 1011 and a head 1012. The neck 1011 may project rearwards from the head 1012, and may come into contact with the front surface of the stationary object W. For example, the neck 1011 may be integrally formed with the head 1012. The neck 1011 and the head 1012 may be configured to have circular plate shapes having different diameters, and may have holes formed therein, through which the fastening element F1 extends. Accordingly, the support 101 may be fixed to the stationary object W by means of the fastening element F1, which is coupled to the stationary object W through the hole thereof.

The neck 1011 may have a smaller diameter than that of the head 1012. The width of the slot SL1, which is formed in the second plate 140, may be larger than the diameter of the neck 1011 but smaller than the diameter of the head 1012. Here, as the bracket 100 moves close to or away from the support 101, the neck 1011 may be moved relative thereto along the slot SL1 in the second plate 140. The head 1012 may be positioned between the first plate 110 and the second plate 140, and may be in contact with the second plate 140.

For example, the bracket 100 may include a pair of brackets 100a and 100b, which are spaced apart from each other in the lateral direction. Here, the support 101 may include a pair of supports 101a and 101b, which are spaced apart from each other in the lateral direction. For example, the pair of brackets 100a and 100b may be positioned adjacent to the left and right sides of the back cover 40 so as to be bilaterally symmetrical. Consequently, the pair of brackets 100a and 100b are capable of stably supporting the load of the display device 1 installed on the stationary object W. The number of brackets 100 provided at the display device 1 is not limited thereto, and one bracket or three or more brackets may be provided, depending on the size or weight of the display device 1.

Figure 8:
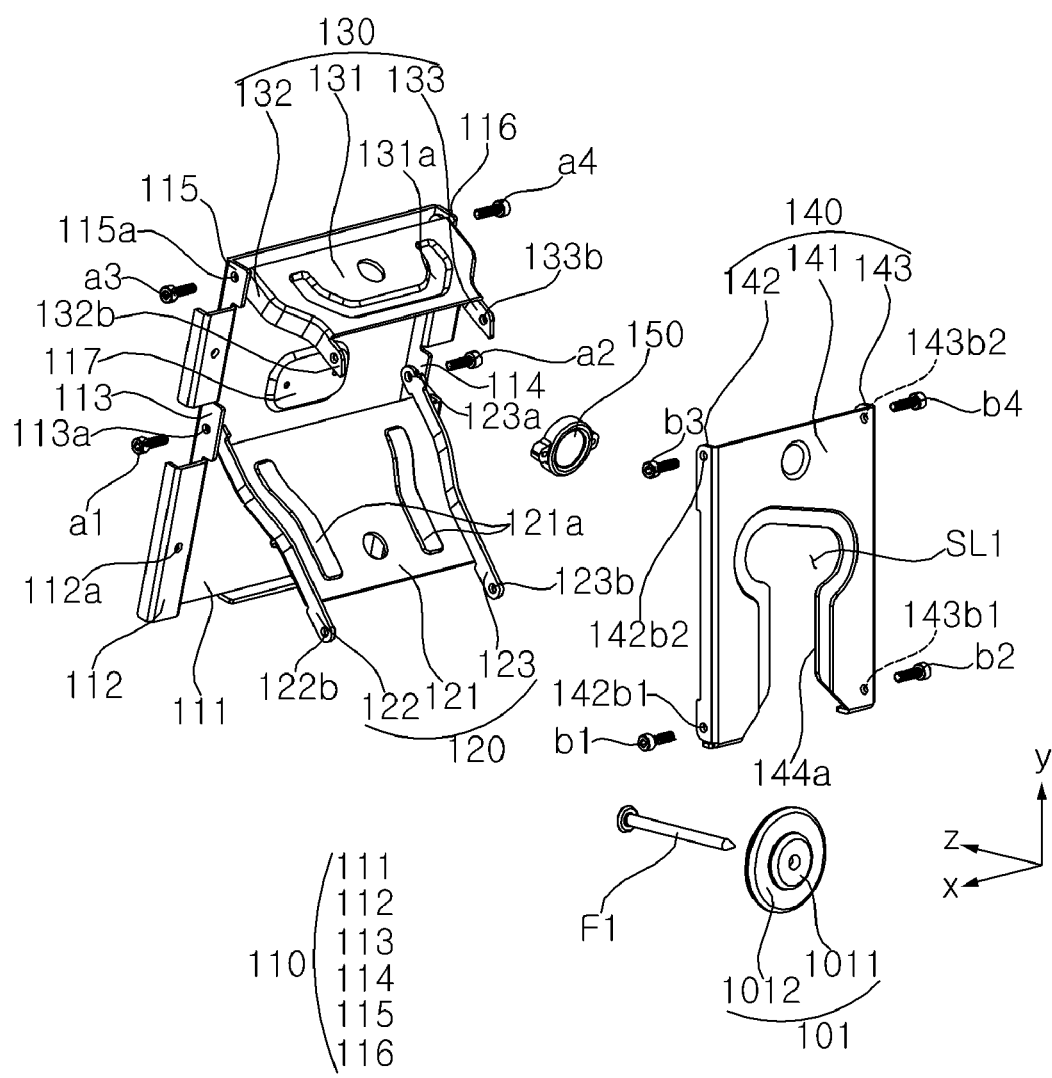
Figure 9:
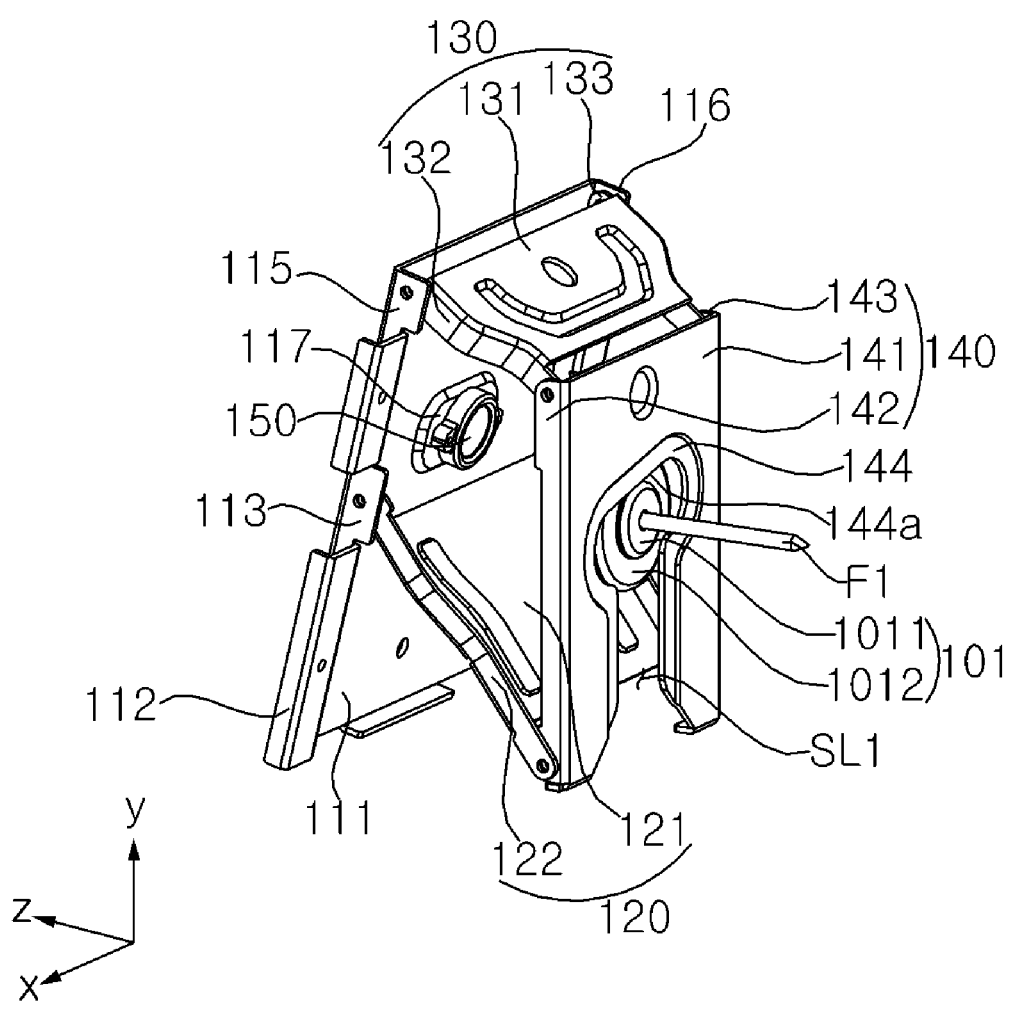

Referring to FIGS. 8 and 9, the first plate 110 may include a first body 111 and couplers 112. The first body 111 may be configured to have a rectangular plate shape overall. The couplers 112 may extend rearwards from the left and right sides of the first body 111, and may be bent at least once so as to have surfaces that face the mounting portion 41 (see FIG. 6). Here, holes 112a may be formed through the surfaces of the couplers 112 that face the mounting portion 41, and fastening elements (not shown), such as screws, may be coupled to the mounting portion 41 (see FIG. 6) through the holes 112a in order to fix the first plate 110 to the mounting portion 41.

The second plate 140 may include the slot SL1, a second body 141, and second parts 142 and 143. The slot SL1 may be formed toward the inside of the second plate 140 from the lower side of the second plate 140. The slot SL1 may provide a space, along which the support 101 moves, and may guide the movement of the support 101. This will be described in more detail later. The second body 141 may be configured to have a rectangular plate shape overall, and may have the slot SL1 therein. The second parts 142 and 143 may project forwards from the left and right sides of the second body 141, and may have therein holes 142b1, 142b2, 143b1 and 143b2, to which the links 120 and 130 are connected.

The links 120 and 130 may include a lower link 120 and an upper link 130. The upper link 130 may be positioned above the lower link 120. Each of the lower link 120 and the upper link 130 may extend in a direction intersecting the first plate 110 and the second plate 140, and may be pivotably coupled to the first plate 110 and the second plate 140.

The lower link 120 may include lower bodies 122 and 123 and first and second lower pivot shafts. The lower bodies 122 and 123 may extend in the direction intersecting the first plate 110 and the second plate 140. For example, each of the lower bodies 122 and 123 may be configured to have a rectangular beam shape overall. Each of the lower bodies 122 and 123 may be bent at least once so as to increase the torsional and/or bending rigidity of the lower link 120.

For example, the lower bodies 122 and 123 may include a pair of lower bodies 122 and 123, which are spaced apart from each other in a lateral direction. Here, the lower link 120 may include a lower plate 121, which is provided between the pair of lower bodies 122 and 123 so as to connect the pair of lower bodies 122 and 123 to each other. The lower plate 121 may be provided with lower reinforcing portions 121a, which are depressed inwards from the lower plate 121 so as to increase the torsional and/or bending rigidity of the lower link 120.

The first lower pivot shaft may extend in a direction intersecting the longitudinal direction of the lower bodies 122 and 123, at first ends of the lower bodies 122 and 123, and may be coupled to the first plate 110. Specifically, first lower parts 113 and 114 of the first plate 110 may project rearwards from the first body 111, and may be provided with first lower holes 113a and 114a, through which first lower fastening elements a1 and a2 extend. First ends of the lower bodies 122 and 123 may be disposed so as to face the first lower parts 113 and 114, and may be provided with first holes 122a and 123a, which communicate with the first lower holes 113a and 114a. Here, the first lower fastening elements a1 and a2, such as bolts, may extend through the first lower holes 113a and 114a and the first holes 122a and 123a, and may be engaged with elements (not shown) such as nuts. Consequently, the first ends of the lower bodies 122 and 123 may be pivotably coupled to the first lower parts 113 and 114. The central axis of the first lower fastening elements a1 and a2 may be coaxial with the first lower pivot shaft. In other words, the first lower fastening elements a1 and a2 may serve as the first lower pivot shaft, and the first ends of the lower bodies 122 and 123 may be rotated about the central axis of the first lower fastening elements a1 and a2.

The second lower pivot shafts may extend in a direction parallel to the first lower pivot shaft at the second ends of the lower bodies 122 and 123, and may be coupled to the second plate 140. Specifically, the second parts 142 and 143 of the second plate 140 may project forwards from the second body 141, and may have formed therein the second lower holes 142b1 and 143b1, through which second lower fastening elements b1 and b2 extend. The second ends of the lower bodies 122 and 123 may be disposed so as to face the second parts 142 and 143, and may have formed therein second holes 122b and 123b, which communicate with the second lower holes 142b1 and 143b1. Here, the second lower fastening elements b1 and b2, such as bolts, may extend through the second lower holes 142b1 and 143b1 and the second holes 122b and 123b, and may be engaged with elements such as nuts (not shown). Consequently, the second ends of the lower bodies 122 and 123 may be pivotably coupled to the second parts 142 and 143. Here, the central axis of the second lower fastening elements b1 and b2 may be coaxial with the second lower pivot shaft. In other words, the second lower fastening elements b1 and b2 may serve as the second lower pivot shaft, and the second ends of the lower bodies 122 and 123 may be rotated about the central axis of the second lower fastening elements b1 and b2.

The upper link 130 may include upper bodies 132 and 133, a first upper pivot shaft, and a second upper pivot shaft. The upper bodies 132 and 133 may extend in the longitudinal direction of the upper link 130, that is, in a direction intersecting the first plate 110 and the second plate 140. For example, each of the upper bodies 132 and 133 may be configured to have a rectangular beam shape overall. Here, each of the upper bodies 132 and 133 may be bent at least once so as to increase the torsional and/or bending rigidity of the upper link 130.

For example, the upper bodies 132 and 133 may include a pair of upper bodies 132 and 133, which are spaced apart from each other in a lateral direction. The upper link 130 may include an upper plate 131, which connects the pair of upper bodies 132 and 133 to each other. The upper plate 131 may be provided with an upper reinforcing portion 131a, which is depressed inwards from the upper plate 131 so as to increase the torsional and/or bending rigidity of the upper link 130.

The first upper pivot shaft may extend in a direction intersecting the longitudinal direction of the upper bodies 132 and 133, at first ends of the upper bodies 132 and 133, and may be coupled to the first plate 110. Specifically, first upper parts 115 and 116 of the first plate 110 may project rearwards from the first body 111, and may have formed therein first upper holes 115a and 116a, through which first upper fastening elements a3 and a4 extend. The first ends of the upper bodies 132 and 133 may be disposed so as to face the first upper parts 115 and 116, and may have formed therein first holes 132a and 133a, which communicate with the first upper holes 115a and 116a. Here, the first upper fastening elements a3 and a4, such as bolts, may extend through the first upper holes 115a and 116a and the first holes 132a and 133a, and may be engaged with elements such as nuts (not shown). Consequently, the first ends of the upper bodies 132 and 133 may be pivotably coupled to the first upper parts 115 and 116. Here, the central axis of the first upper fastening elements a3 and a4 may be coaxial with the first upper pivot shaft. In other words, the first upper fastening elements a3 and a4 may serve as the first upper pivot shaft, and the first ends of the upper bodies 132 and 133 may be rotated about the central axis of the first upper fastening elements a3 and a4.

The second upper pivot shaft may extend in a direction parallel to the first upper pivot shaft at the second ends of the upper bodies 132 and 133, and may be coupled to the second plate 140. Specifically, the second parts 142 and 143 of the second plate 140 project forwards from the second body 141, and may have formed therein the second upper holes 142b2 and 143b2, through which the second upper fastening elements b3 and b4 extend. The second ends of the upper bodies 132 and 133 may be disposed so as to face the second parts 142 and 143, and may have formed therein second holes 132b and 133b, which communicate with the second upper holes 142b2 and 143b2. The second upper fastening elements b3 and b4, such as bolts, may extend through the second upper holes 142b2 and 143b2 and the second holes 132b and 133b, and may be engaged with elements such as nuts (not shown). Consequently, the second ends of the upper bodies 132 and 133 may be pivotably coupled to the second parts 142 and 143. Here, the central axis of the second upper fastening elements b3 and b4 may be coaxially with the second upper pivot shaft. In other words, the second upper fastening elements b3 and b4 may serve as the second upper pivot shaft, and the second ends of the upper bodies 132 and 133 may be rotated about the central axis of the second upper fastening elements b3 and b4.

A guide portion 144 of the second body 141 may have a guide portion 144a that defines the boundary of the slot SL1. For example, the guide portion 144 may be depressed forwards from the second body 141 so as to form a stepped portion. When the second plate 140 is moved toward the support 101 fixed to the stationary object W (see FIG. 6) by means of the fastening element F1, the neck 1011 of the support 101 may move along the slot SL1 relative thereto. At this time, the guide portion 144a may guide the movement of the neck 1011. When the support 101 is seaed in the slot SL1, the front surface of the guide portion 144 may come into contact with the rear surface of the head 1012, and thus the support 101 may support the load of the bracket 100 and the display device 1 coupled to the bracket 100.

Figure 10:
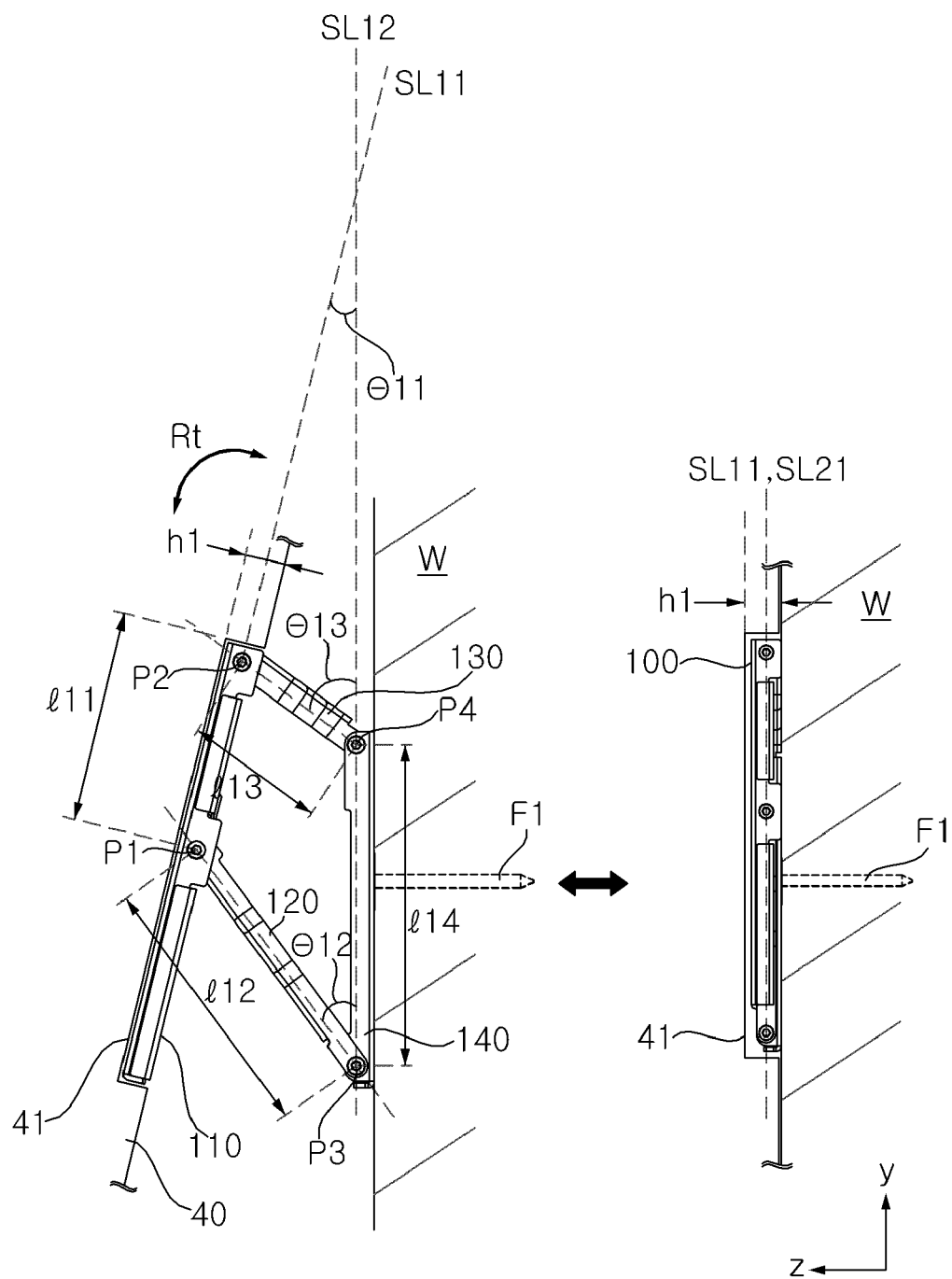

Referring to FIG. 10, the links 120 and 130 may be positioned between the first plate 110 and the second plate 140, and may be pivotably coupled to the first plate 110 and the second plate 140. Here, when the links 120 and 130 are rotated in a first rotational direction (for example, in a counterclockwise direction), the first plate 110 may be moved forwards away from the second plate 140 while being inclined. In contrast, when the links 120 and 130 are rotated in a rotational direction opposite the first rotational direction (for example, in a clockwise direction), the first plate 110 may come close to the second plate 140 and may thus be disposed so as to be parallel to the second plate 140.

Here, the first lower pivot shaft is denoted by reference mark P1, the first upper pivot shaft is denoted by reference mark P2, the second lower pivot shaft is denoted by reference mark P3, and the second upper pivot shaft is denoted by reference mark P4.

The first lower pivot shaft P1 may be positioned under the first upper pivot shaft P2, and the second lower pivot shaft P3 may be positioned under the second upper pivot shaft P4. A first length 111, which is the length of the first imaginary line SL11, which extends from the first lower pivot shaft P1 to the first upper pivot shaft P2, may be maintained constant. Furthermore, a second length 114, which is the length of the second imaginary line SL12, which extends from the second lower pivot shaft P3 to the second upper pivot shaft P4, may be maintained constant. Here, the first length 111 may be shorter than the second length 114, and the lower link 120 may be longer than the upper link 130. In other words, the length 112 between the first lower pivot shaft P1 and the second lower pivot shaft P3 may be greater than the length 113 between the first upper pivot shaft P2 and the second upper pivot shaft P4.

When the lower link 120 and the upper link 130 are pivoted such that the longitudinal direction of the lower link 120 intersects the longitudinal direction of the upper link 130 (see the left figure in FIG. 10), the extension of the first imaginary line SL11 may intersect the extension of the second imaginary line SL12, with an included angle θ11 defined therebetween. The longitudinal axis of the lower link 120 may be inclined with respect to the second imaginary line SL12 by θ12, and the longitudinal axis of the upper link 130 may be inclined with respect to the second SL12 by θ13, which is larger than θ12. θ11 is an acute angle smaller than θ12. The lower link 120 and the upper link 130 may have different lengths, and the opposite ends of each of the lower link 120 and the upper link 130 serve as fixed ends. Consequently, rotation of the lower link 120 and the upper link 130 in the first rotational direction (for example, in a counterclockwise direction) may be stopped when θ11 becomes a specific angle.

As a result, when θ11 becomes the specific angle, the first plate 110 may be maintained in the state of being spaced apart from the second plate 140 while being inclined. Since the first plate 110 is spaced apart from the second plate 140 forwards when θ11 becomes the specific angle, it is possible for a user to easily recognize the positions of the support 101 fixed to the stationary object W and the slot SL1 by means of the fastening element F1 (see FIG. 9), thereby improving convenience in installation. Furthermore, since the first plate 110 is maintained in a state of being inclined with respect to the second plate 140 when θ11 becomes the specific angle, it is possible for a user to easily access the rear surface of the back cover 40 in the state in which the back cover 40 is coupled to the stationary object W. Accordingly, it is possible for a user to easily connect or disconnect cables, USB devices or the like to or from various ports provided at the rear surface of the back cover 40.

Figure 11:
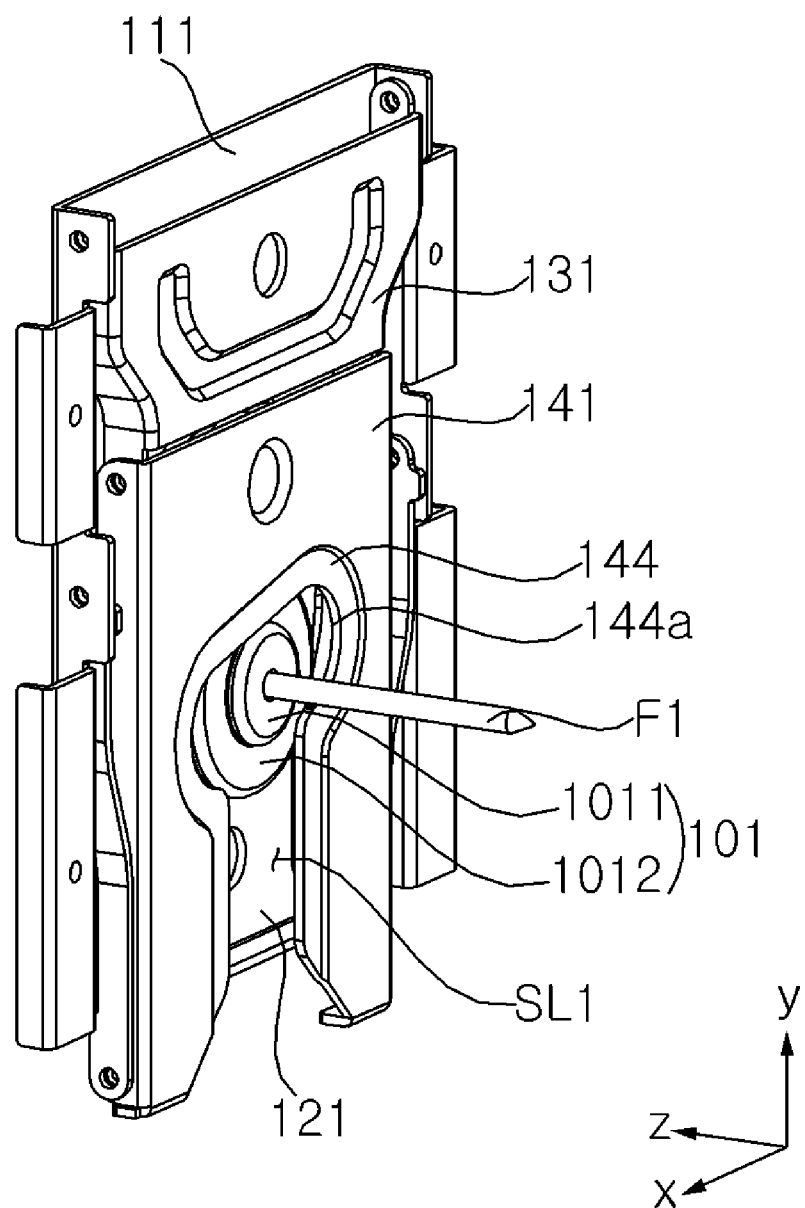

Referring to FIGS. 10 and 11, when the lower link 120 and the upper link 130 are pivoted such that the longitudinal direction of the lower link 120 is parallel to the longitudinal direction of the upper link 130 (see the right figure in FIG. 10), the extension of the first imaginary line SL11 and the extension of the second imaginary line SL12 may be disposed so as to be parallel to each other. For example, the extension of the first imaginary line SL11 and the extension of the second imaginary line SL12 may be disposed so as to be parallel to each other in a vertical direction. In this state, the first plate 110 may surround at least a portion of the second plate 140, and the lower link 120 and the upper link 130 may be disposed so as to be parallel to each other in a vertical direction between the first plate 110 and the second plate 140.

As a result, since the thickness of the bracket 100 in an anteroposterior direction is minimized, the distance between the back cover 40 and the stationary object W may be minimized. Furthermore, the mounting portion 41, in which the first plate 110 of the bracket 100 is fixed, may be depressed from the rear surface of the back cover 40, thereby forming a stepped portion. Here, the depth h1 of the mounting portion 41 in the back cover 40 may be equal to or greater than the thickness of the first plate 110. Consequently, since the rear surface of the second plate 140 is positioned so as to be flush with or to be close to the remainder of the surface of the back cover 40 other than the mounting portion 41, it is possible to cause the entire area of the back cover 40 to be in close contact with the stationary object W.

Figure 12:
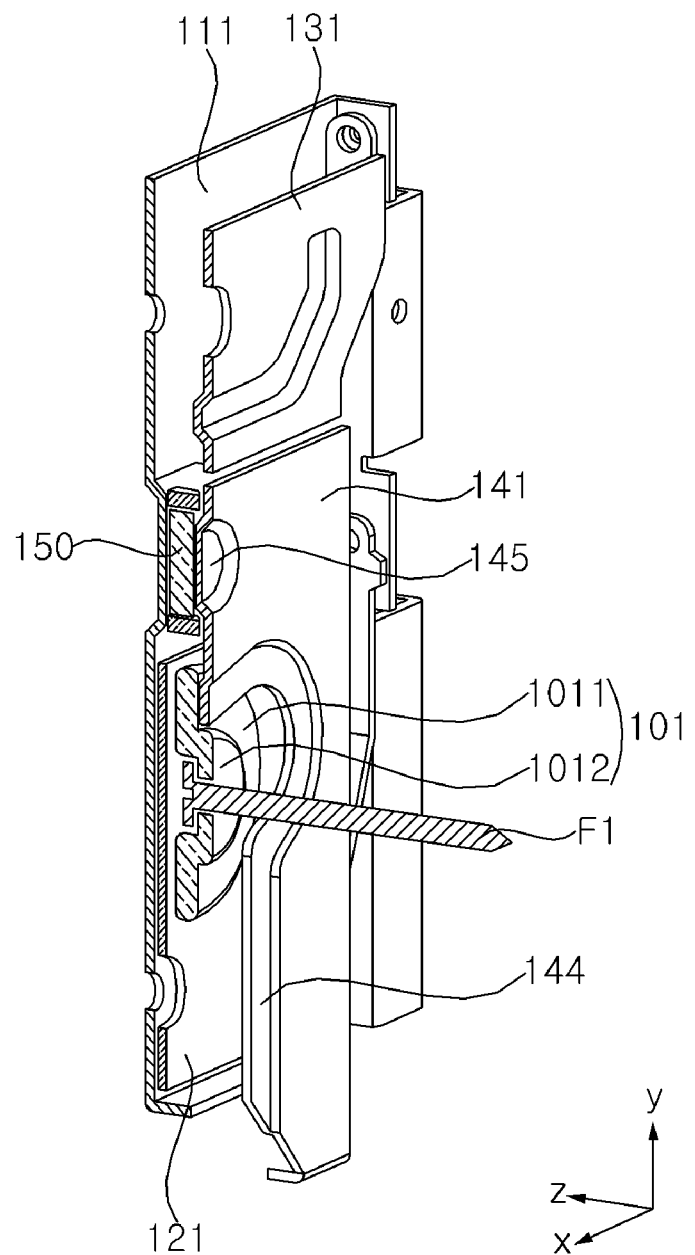

Referring to FIGS. 8 and 12, a magnet 150 may be disposed between the first plate 110 and the second plate 140 and may be secured to the first plate 110. For example, a portion of the rear surface of the first body 111 of the first plate 110 may include a coupler 117, to which the magnet 150 is coupled. The magnet 150 may be secured to the coupler 117 by means of a fastening element such as a screw (not shown).

In this case, the magnet 150 may be magnetically coupled to the second plate 140. In other words, the second body 141 of the second plate 140 may include a magnetic substance, such as iron, in order to establish a magnetic attraction between the second body 141 and the magnet 150.

Accordingly, when the lower plate 121 and the upper plate 131 are disposed so as to be parallel to each other, and the thickness of the bracket 100 is thus minimized, the magnet 150 may be magnetically coupled to a local region 145 of the second body 141. In other words, the magnet 150 is capable of increasing the binding force between the second plate 140 and the first plate 110. In other words, in order to tilt the first plate 110 relative to the second plate 140, there may be a need to apply external force capable of overcoming the magnetic attraction acting between the magnet 150 and the local region 145. In addition, the magnet 150 may provide a user with a pleasant sensation of magnetic coupling or separation in the change between the tilted position in which the first plate 110 is inclined with respect to the second plate 140 (see the left figure in FIG. 10), and the close position, in which the first plate 110 surround the second plate 140.

Figure 13:
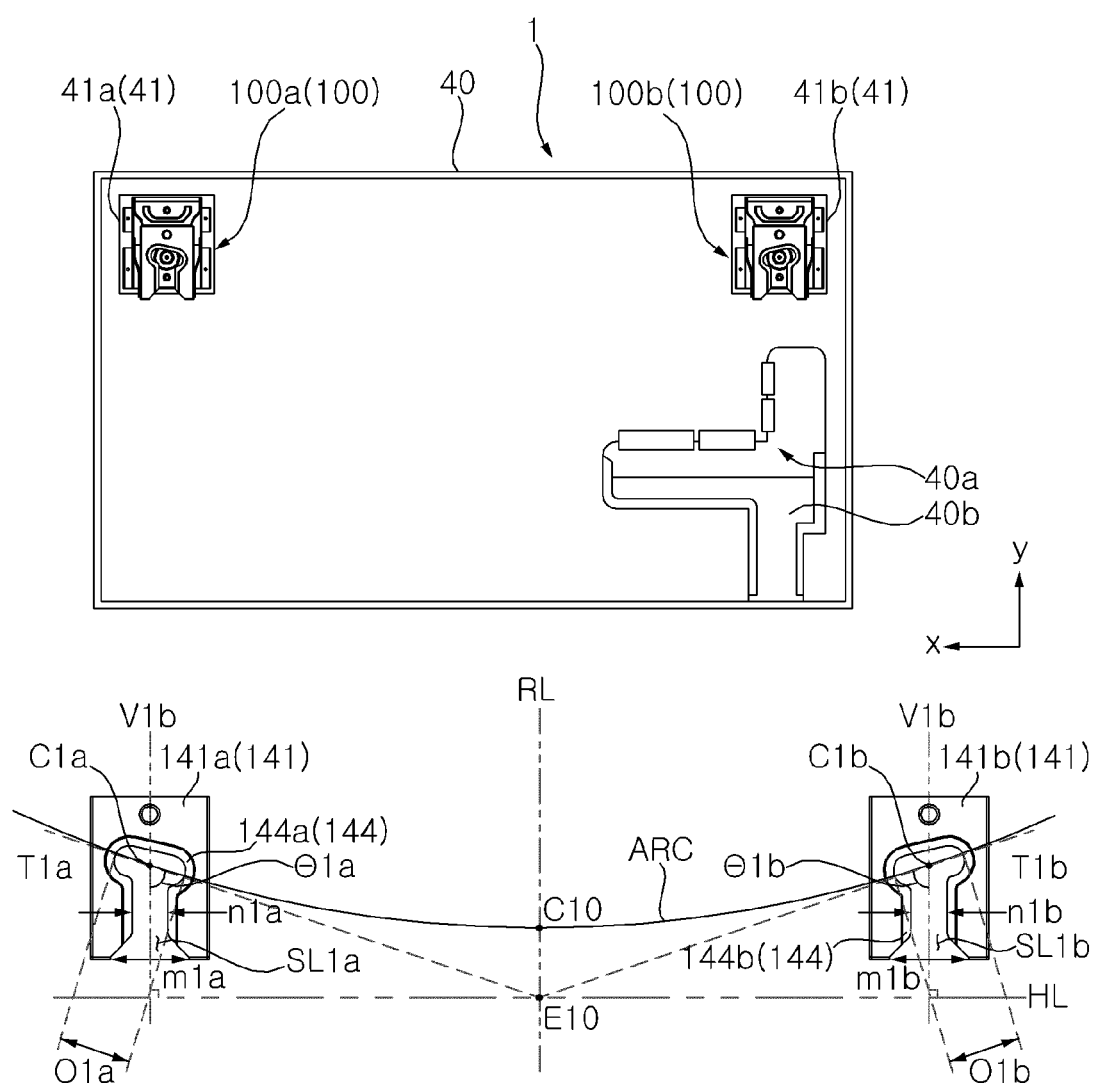

Referring to FIG. 13, the bracket 100 may include a left bracket 100a, which is fixed to the left mounting portion 41a adjacent to the left side of the back cover 40, and a right bracket 100b, which is fixed to the right mounting portion 41b adjacent to the right side of the back cover 40. Here, the left slot SL1a in the left bracket 100a and the right slot SL1b in the right bracket 100b may be bilaterally symmetrical.

The left slot SL1a may be formed upwards from the lower side of the second body 141a of the left bracket 100a. The left slot SL1a may be sectionally divided into a left entry path, a left link path and a left seating path. The width of the left entry path may be m1a at the lower end thereof, and may be reduced moving upwards. The left link path may be connected to the upper end of the left entry path, and the width of the left link path may be n1a, which is equal to the width of the upper end of the left entry path and may be constant in a vertical direction. The left seating path may be connected to the upper end of the left link path, and may be formed in a direction intersecting the left imaginary vertical line V1b, which extends vertically through the center C1a of the left seating path. The width of the left seating path in the direction, in which the left seating path is formed, may be O1a. Here, any of the width of the left entry path, the width of the left link path and the width of the left seating path may be larger than the diameter of the neck 1011 of the support 101 (see FIG. 8).

Accordingly, the left support 101a (see FIG. 7), which is fixed to the stationary object W, may easily enter the left entry path having a relatively large width, and may be guided into the left seating path along the left link path by means of the left guide portion 144a, which defines the boundary of the left slot SL1a. When the left support 101a is seated on the left seating path, the front surface of the left guide portion 144a comes into contact with the head 1012, and the left support 101a is thus capable of supporting the load of the left bracket 100a and the display device 1 coupled to the left bracket 100a.

The right slot SL1b may be formed upwards from the lower side of the second body 141b of the right bracket 100b. The right slot SL1b may be sectionally divided into a right entry path, a right link path and a right seating path. The width of the right entry path may be m1b at the lower end thereof, and may be reduced moving upwards. The right link path may be connected to the upper end of the right entry path, and the width of the right link path may be n1b, which is equal to the width of the upper end of the right entry path, and may be constant in a vertical direction. The right seating path may be connected to the upper end of the right link path, and may be formed in a direction intersecting the right imaginary vertical line V1b, which extends vertically through the center C1b of the right seating path. The width of the right seating path in the direction, in which the right seating path is formed, may be O1b. Here, any of the width of the right entry path, the width of the right link path and the width of the right seating path may be larger than the diameter of the neck 1011 of the support 101 (see FIG. 8).

Accordingly, the right support 101b (see FIG. 7), which is fixed to the stationary object W, may easily enter the right entry path having a relatively large width, and may be guided into the right seating path along the right link path by means of the right guide portion 144b, which defines the boundary of the right slot SL1b. When the right support 101b is seated on the right seating path, the front surface of the right guide portion 144b comes into contact with the head 1012, and the right support 101b is thus capable of supporting the load of the right bracket 100b and the display device 1 coupled to the right bracket 100b.

The left slot SL1a and the right slot SL1b may be bilaterally symmetrical. Specifically, the width m1a of the lower end of the left entry path may be equal to the width m1b of the lower end of the right entry path, and the width n1a of the left link path may be equal to the width n1b of the right link path. The center C1a of the left seating path and the center C1b of the right seating path may be located on an imaginary arc. Here, the imaginary arc may intersect the vertical line RL at the center point C10.

Here, the left tangent line T1a to the imaginary arc may extend through the center C1a of the left seating path and may be tangent to the arc. The right tangent line T1b may extend through the center C1b of the right seating path and may be tangent to the arc. The left tangent line T1a and the right tangent line T1b may intersect the cross point E10 on the vertical line RL, and the cross point E10 may be located under the center point C10 of the arc. In other words, the left tangent line T1a may extend to the cross point E10, and may define a predetermined angle θ1a with respect to the left vertical line V1b. The right tangent line T1b may extend to the cross point E10, and may define a predetermined angle θ1b with respect to the right vertical line V1b. Here, the predetermined angles θ1a and θ1b may be equal to each other, and may each be an acute angle.

For example, the left seating path may be formed along the left tangent line T1a, and the right seating path may be formed along the right tangent line T1b. In other words, the left seating path and the right seating path may be bilaterally symmetrical. Consequently, when the left support 101a and the right support 101b seat on the left seating path and the right seating path, respectively, the bracket 100 and the display device 1 coupled to the bracket 100 may be maintained in a certain position as long as external force is not applied to the bracket 100.

The back cover 40 may be provided on the rear surface thereof with various ports 40a, to which a cable, a USB device and the like are connected. For example, the back cover 40 may be provided in the rear surface thereof with recess 40b, which is depressed forwards from the rear surface of the back cover 40 adjacent to the ports so as to provided a space in which the cable, the USB device and the like are inserted into and separated from the ports 40a. Accordingly, it is possible to prevent the cable, the USB device and the like, which are connected to the ports 40a, from projecting rearwards from the back cover 40, which is advantageous in reducing the thickness of the display device 1.

Figure 14:
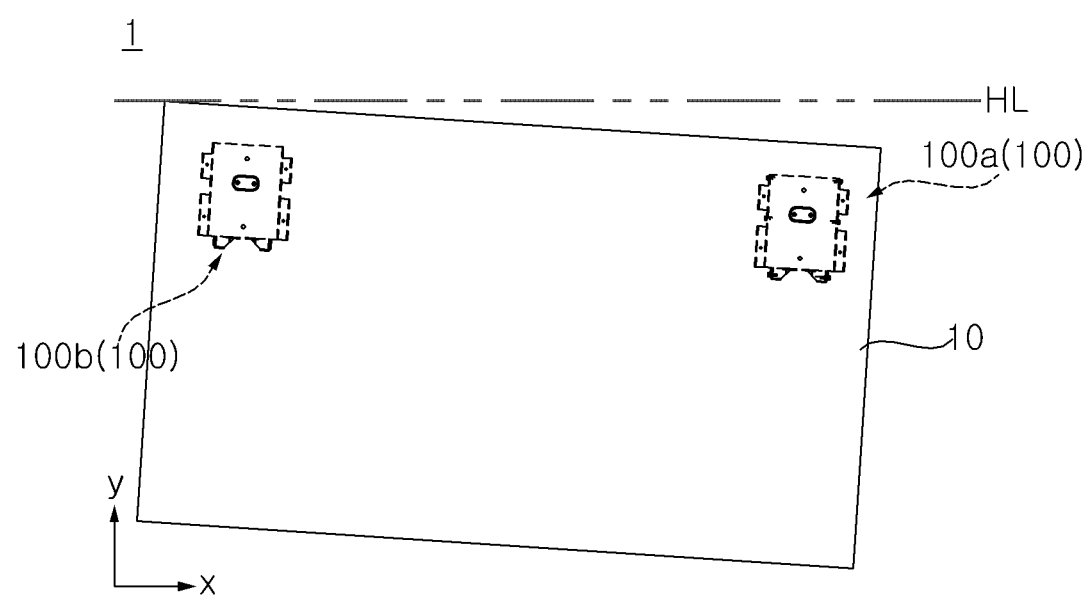
Figure 15:
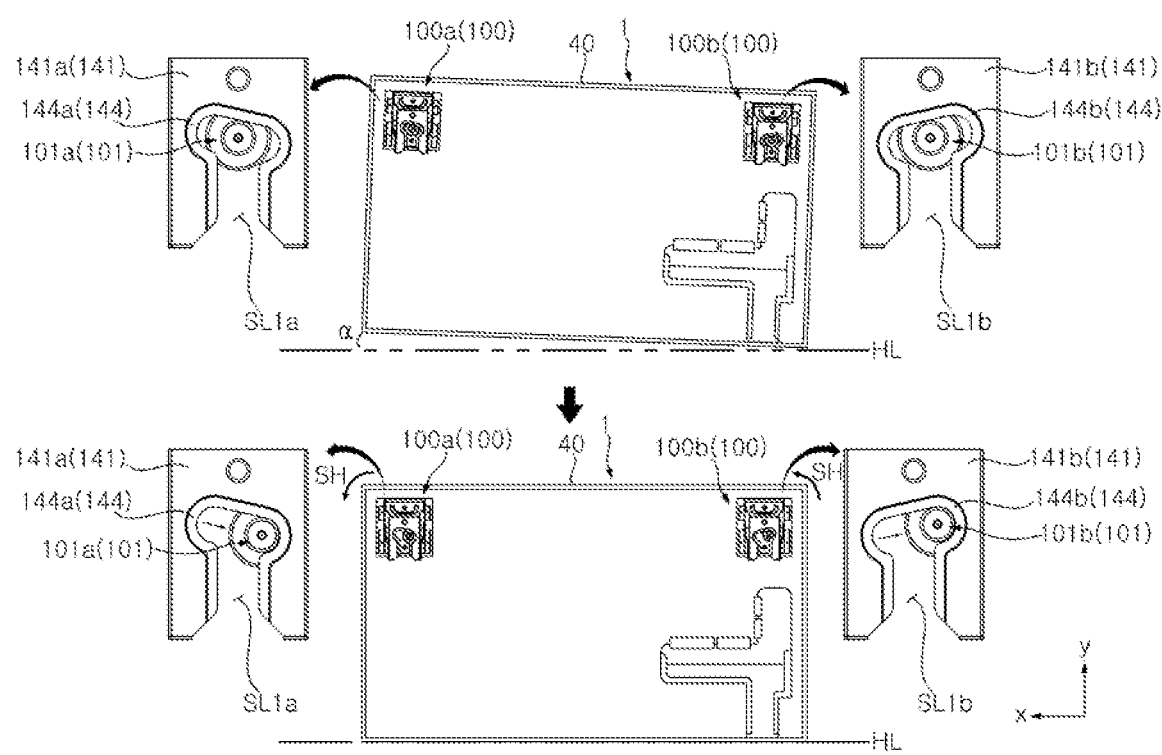
Figure 16:
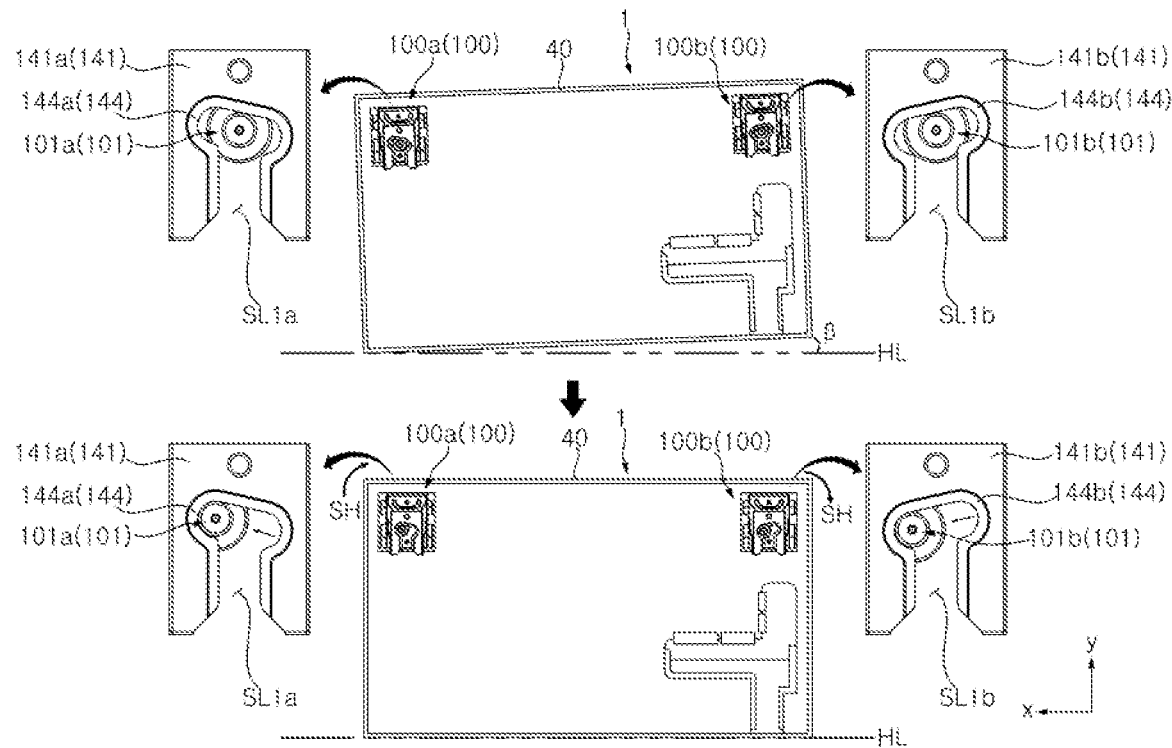

Referring to FIGS. 14 to 16, the display device 1 may be installed on the stationary object W (see FIG. 6) by means of the bracket 100, and may thus be maintained in the immobile state.

Referring to FIG. 14, the left bracket 100a and the right bracket 100b may be out of alignment with the horizontal line HL, and the display device 1 may thus be maintained in a non-horizontal position and in an immobile state.

Referring to FIGS. 15 and 16, when external force is applied to the bracket 100, the supports 101 may be relatively moved in the left seating path and the right seating path, respectively, thereby making it possible to adjust the slope of the display device 1 with respect to the horizontal line HL.

For example, the bracket 100 and the left part of the display device 1 coupled to the bracket 100 may be inclined upwards with respect to the horizontal line HL by a predetermined angle α (see the upper figure in FIG. 15). A user is able to adjust the position of the display device 1 to be horizontal by action of shifting (SH) the right part of the display device 1 upwards while shifting (SH) the left part of the display device 1 downwards (see the lower figure in FIG. 15). At this point, the left support 101a may be lowered while being moved rightwards on the left seating path, and the right support 101b may be raised while being moved rightwards on the right seating path.

Meanwhile, the bracket 100 and the right part of the display device 1 coupled to the bracket 100 may be inclined by a predetermined angle β with respect to the horizontal line HL (see the upper figure in FIG. 16). A user is able to adjust the position of the display device 1 to be horizontal through an action of shifting (SH) the left part of the display device 1 upwards while shifting (SH) the right part of the display device 1 downwards (see the lower figure in FIG. 16). At this point, the left support 101a may be raised while being moved leftwards on the left seating path, and the right support 101b may be lowered while being moved leftwards on the right seating path.

Figure 17:
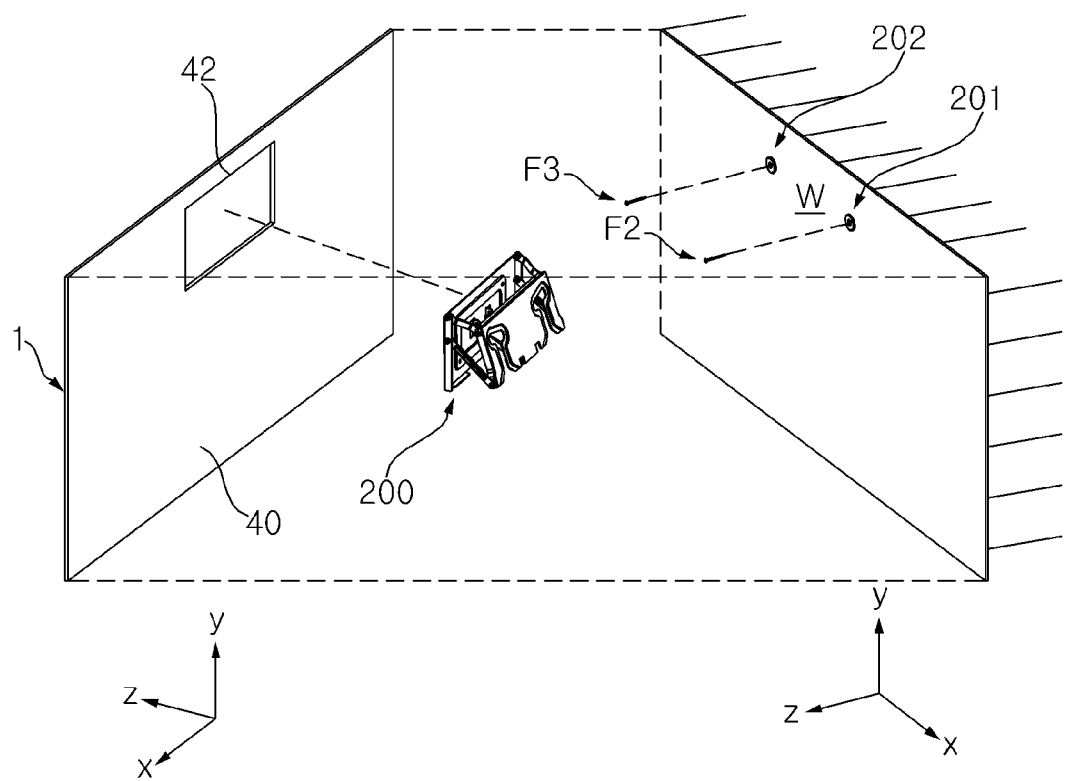

Referring to FIG. 17, the display device 1 may be installed on the stationary object W, such as a wall, by means of a bracket 200 coupled to the back cover 40 and supports 201 and 202 fixed to the stationary object W. Here, the bracket 200 may be referred to as a mount, and the supports 201 and 202 may be referred to as pins, holders or spacers.

Specifically, the bracket 200 may be fixed to a mounting portion 42 of the back cover 40. The supports 201 and 202 may be fixed to the stationary object W by means of fastening elements F2 and F3, such as nails or screws. Here, the bracket 200 may be coupled to the supports 201 and 202 while coming close to the supports 201 and 202, or may be separated from the supports 201 and 202 while being moved away from the supports 201 and 202. This will be described in more detail later.

Figure 18:
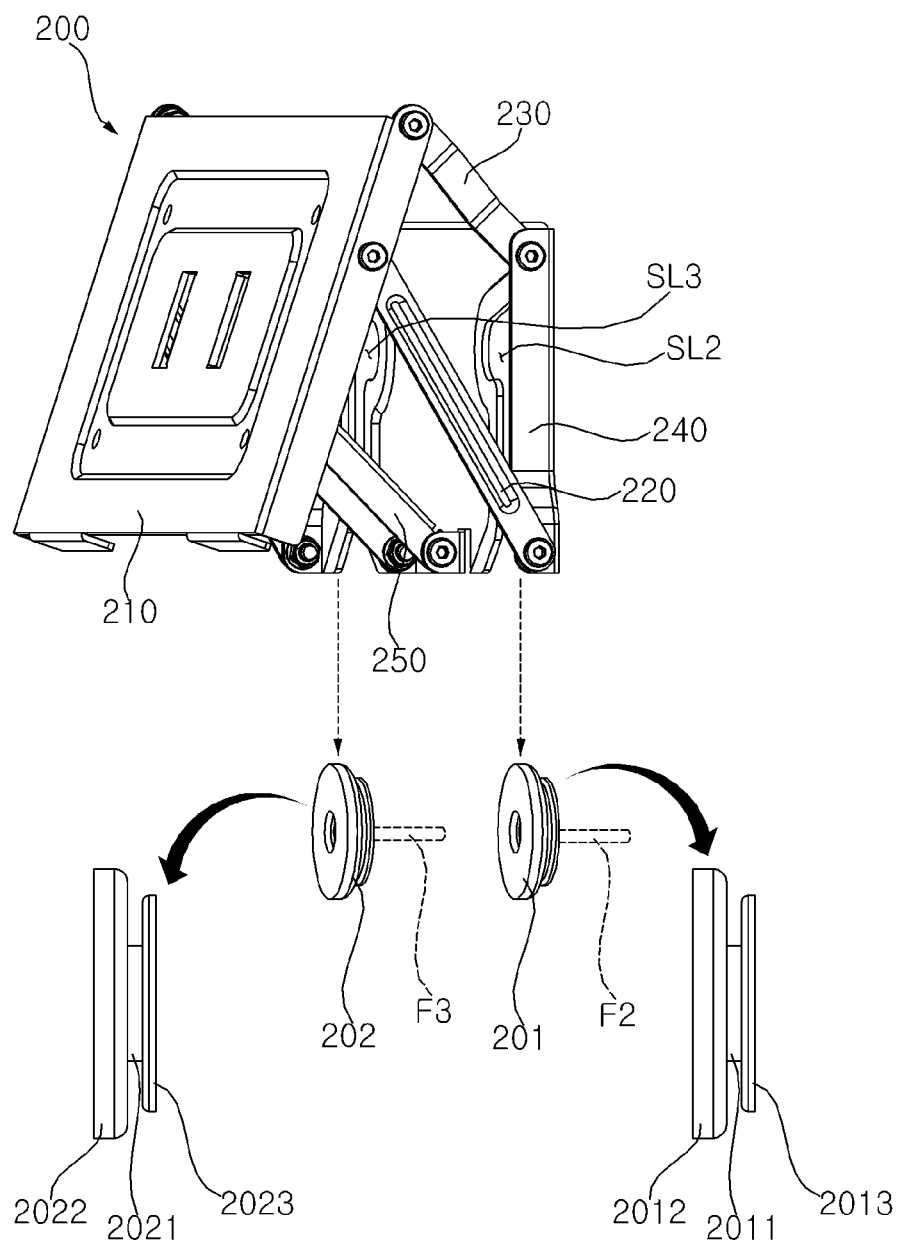

Referring to FIGS. 17 and 18, the bracket 200 may include a first plate 210, links 220, 230 and 250 and a second plate 240.

The first plate 210 may be fixed to the mounting portion 42 of the back cover 40. The links 220, 230 and 250 may be positioned behind the first plate 210, and may be coupled at first ends thereof to the first plate 210. The second plate 240 may be positioned behind the first plate 210, and second ends of the links 220, 230 and 250 may be coupled to the second plate 240. In other words, the second plate 240 may face the first plate 210 with the links 220, 230 and 250 interposed therebetween.

The supports 201 and 202 may include a first support 201 and a second support 202, which are laterally spaced apart from each other. The first support 210 may include a first neck 2011, a first head 2012 and a first leg 2013. The first neck 2011 may project rearwards from the first head 2012, and the first leg 2013 may face the first head 2012 with the first neck 2011 interposed therebetween. For example, the first neck 2011, the first head 2012 and the first leg 2013 may be integrally formed with one another. The first neck 2011, the first head 2013 and the first leg 2013 may be configured to have circular plate shapes having different diameters, and may be provided with holes, through which a first fastening element F2 extends. Accordingly, the first support 201 may be fixed to the stationary object W by means of the first fastening element F2, which extends through the first support 201 and is coupled to the stationary object W.

The first neck 2011 may have a diameter, which is smaller than any of those of the first head 2013 and the first leg 2013, such that a groove is formed between the first head 2012 and the first leg 2013. Accordingly, a first guide portion 244, which defines the boundary of the first slot SL1, may be fitted into the groove, and may be moved therethrough. The width of the first slot SL1 in the second plate 240 may be larger than the diameter of the first neck 2011 but smaller than the diameter of the first support 2012. At this point, as the bracket 200 is moved close to or away from the first support 201, the first neck 2011 may be moved relative to the first slot SL1. The first head 2012 may be disposed between the first plate 210 and the second plate 240, and may be in contact with the second plate 240.

The second support 202 may have the same construction as the first support 201. Specifically, the second neck 2021, the second head 2022 and the second leg 2023 of the second support 202 may have the same shapes as those of the first neck 2011, the first head 2012 and the first leg 2013 of the first support 201. The second support 202 may be fixed to the stationary object W by means of the second fastening element F3 like the first support 201.

Figure 19:
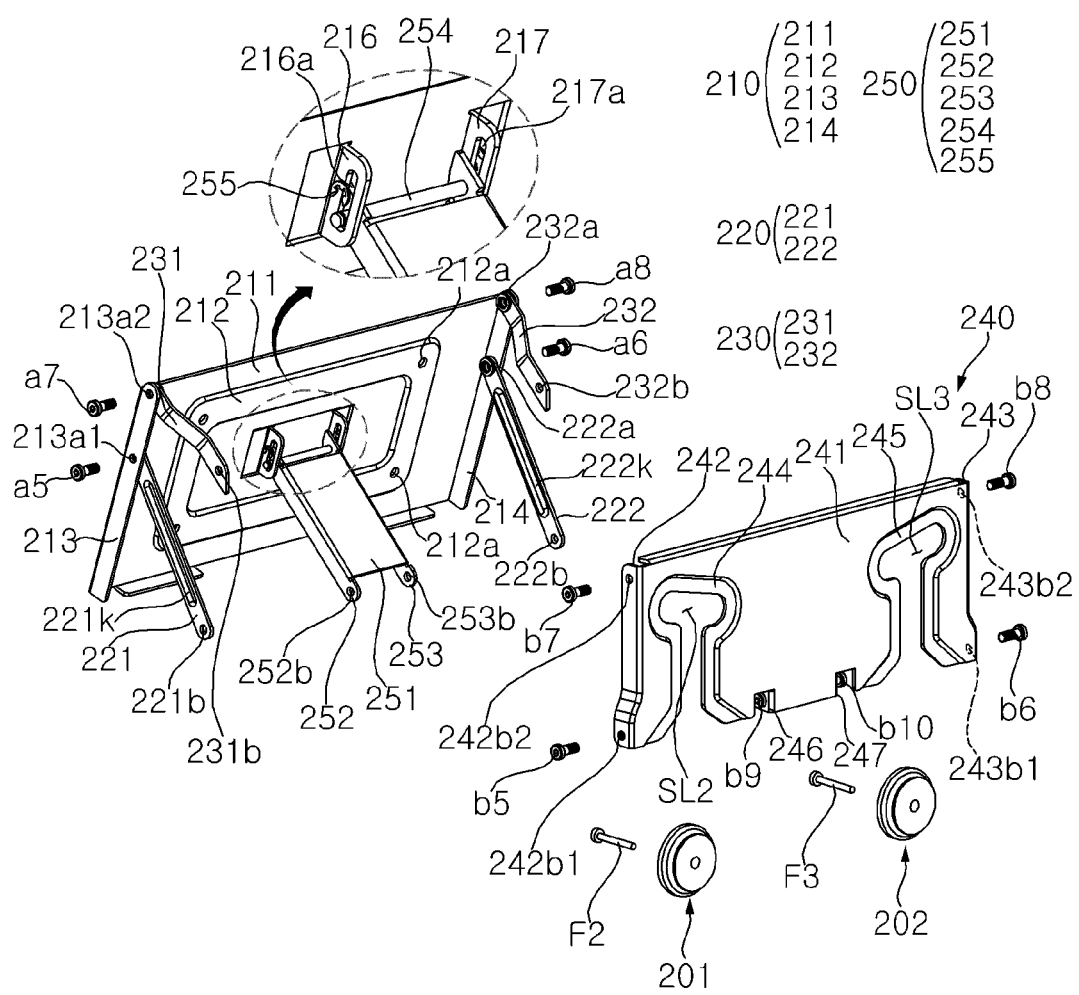
Figure 20:
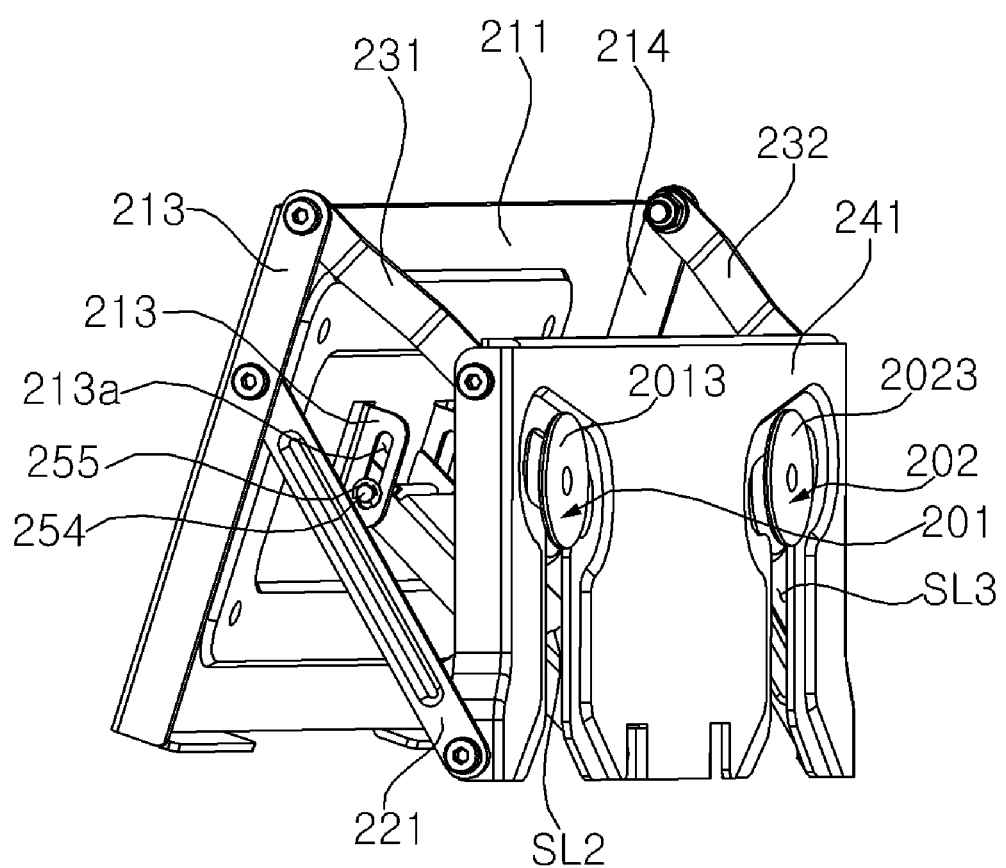

Referring to FIGS. 19 and 20, the first plate 210 may include a first body 211 and a coupler 212. The first body 211 may be configured to have a rectangular plate shape overall. The coupler 212 may be located adjacent to the center of the first body 211. Here, the first plate 210 may be fixed to the mounting portion 42 by coupling fastening elements (not shown), such as a screws, to the mounting portion 42 (see FIG. 17) through holes 212a in the coupler 212. The coupler 212 may be depressed rearwards from the first body 211 so as to increase the torsional and/or bending rigidity of the first plate 210. Here, the coupler 212 may be referred to as a forming portion.

The second plate 240 may include a first slot SL2, a second slot SL3, a second body 241 and second parts 242 and 243. The first slot SL2 and the second slot SL3 may be laterally spaced apart from each other, and may be formed toward the inside from the lower side of the second plate 240. The first slot SL2 provides a space, in which the first support 201 is moved, and may guide the movement of the first support 201. The second slot SL3 may provide a space, in which the second support 202 is moved, and may guide the movement of the second support 202. This will be described in more detail later. The second body 241 may be configured to have a rectangular plate shape overall, and may have therein the first slot SL2 and the second slot SL3. The second parts 242 and 243 may project from the left and right sides of the second body 241, and may have therein holes 242$b$1, 242$b$2, 243$b$1 and 243$b$2, to which the lower link 220 and the upper link 230 are connected.

The links 220, 230 and 250 may include the lower link 220 and the upper link 230. The upper link 230 may be positioned above the lower link 220. The lower link 220 and the upper link 230 may extend in a direction intersecting the first plate 210 and the second plate 240, and may be pivotably coupled to the first plate 210 and the second plate 240.

The lower link 220 may include lower bodies 221 and 222, a first lower pivot shaft and a second lower pivot shaft. The lower bodies 221 and 222 may extend in the longitudinal direction of the lower link 220, that is, in a direction intersecting the first plate 210 and the second plate 240. For example, each of the lower bodies 221 and 222 may be configured to have a rectangular beam shape overall. The lower bodies 221 and 222 may be respectively provided with lower reinforcing portions 221$k$ and 222$k$, which are respectively depressed inwards from the lower bodies 221 and 222 so as to increase the torsional and/or bending rigidity of the lower link 220.

For example, the lower bodies 221 and 222 may include a pair of lower bodies 221 and 222, which are laterally spaced apart from each other. The pair of lower bodies 221 and 222 may be respectively positioned adjacent to the left and right sides of the first plate 210.

The first lower pivot shaft may extend in a direction intersecting the longitudinal direction of the lower bodies 221 and 222, at the first ends of the lower bodies 221 and 222, and may be coupled to the first plate 210. Specifically, the first parts 213 and 214 of the first plate 210 may respectively project rearwards from the left and right sides of the first body 211, and may have therein first lower holes 213$a$1 and 214$a$1, through which the first lower fastening elements a5 and a6 extend. The first ends of the lower bodies 221 and 222 may be disposed so as to respectively face the first parts 213 and 214, and may have therein first holes 221$a$ and 222$a$, which respectively communicate with the first lower holes 213$a$1 and 214$a$1. The first lower fastening elements a5 and a6, such as bolts, may extend through the first lower holes 213$a$1 and 214$a$1 and the first holes 221$a$ and 222$a$, and may be engaged with elements such as nuts (not shown). Accordingly, the first ends of the lower bodies 221 and 222 may be pivotably coupled to the first parts 213 and 214, respectively. Here, the central axis of the first lower fastening elements a5 and a6 may be coaxial with the first lower pivot shaft. In other words, the first lower fastening elements a5 and a6 may serve as the first lower pivot shaft, and the first ends of the lower body 221 and 222 may be rotated about the central axis of the first lower fastening elements a5 and a6.

The second lower pivot shaft may extend in a direction parallel to the first lower pivot shaft at the second ends of the lower bodies 221 and 222, and may be coupled to the second plate 240. Specifically, the second parts 242 and 243 of the second plate 240 may project forwards from the second body 241, and may have therein the second lower holes 242$b$1 and 243$b$1, through which second lower fastening elements b5 and b6 extend. The second ends of the lower bodies 221 and 222 may be disposed so as to respectively face the second parts 242 and 243, and may respectively have therein second holes 221$b$ and 222$b$, which respectively communicate with the second lower holes 242$b$1 and 243$b$1. The second lower fastening elements b5 and b6, such as bolts, may extend through the second holes 221$b$ and 222$b$ and the second lower holes 242$b$1 and 243$b$1, and may be engaged with elements such as nuts (not shown). Accordingly, the second ends of the lower bodies 221 and 222 may be pivotably coupled to the second parts 242 and 243, respectively. The central axis of the second lower fastening elements b5 and b6 may be coaxial with the second lower pivot shaft. In other words, the second lower fastening elements b5 and b6 may serve as the second lower pivot shaft, and the second ends of the lower bodies 221 and 222 may be rotated about the central axis of the second lower fastening elements b5 and b6.

The upper link 230 may include upper bodies 231 and 232, a first upper pivot shaft and a second upper pivot shaft. The upper bodies 231 and 232 may extend in the longitudinal direction of the upper link 230, that is, in a direction intersecting the first plate 210 and the second plate 240. For example, each of the upper bodies 231 and 232 may be configured to have a rectangular beam shape overall. Each of the upper bodies 231 and 232 may be bent at least once so as to increase the torsional and/or bending rigidity of the upper link 230.

For example, the upper bodies 231 and 232 may include a pair of upper bodies 231 and 232, which are laterally spaced apart from each other. The pair of upper bodies 231 and 232 may be respectively positioned adjacent to the left and right sides of the first plate 210.

The first upper pivot shaft may extend in a direction intersecting the longitudinal direction of the upper bodies 231 and 232, at the first ends of the upper bodies 231 and 232, and may be coupled to the first plate 210. Specifically, the first parts 213 and 214 of the first plate 210 may respectively project from the left and right sides of the first body 211, and may respectively have therein first upper holes 213$a$2 and 214$a$2, through which first upper fastening elements a7 and a8 respectively extend. The first ends of the upper bodies 231 and 232 may be disposed so as to respectively face the first parts 213 and 214, and may respectively have therein first holes 231$a$ and 232$a$, which respectively communicate with the first upper holes 213$a$2 and 214$a$2. The first upper fastening elements a7 and a8, such as bolts, may extend through the first upper holes 213$a$2 and 214$a$2 and the first holes 231$a$ and 232$a$, and may be engaged with elements such as nuts (not shown). Accordingly, the first ends of the upper bodies 231 and 232 may be pivotably coupled to the first parts 213 and 214, respectively. The central axis of the first upper fastening elements a7 and a8 may be coaxial with the first upper pivot shaft. In other words, the first upper fastening elements a7 and a8 may serve as the first upper pivot shaft, and the first ends of the upper bodies 231 and 232 may be rotated about the central axis of the first upper fastening elements a7 and a8.

The second upper pivot shaft may extend in a direction parallel to the first upper pivot shaft at the second ends of the upper bodies 231 and 232, and may be coupled to the second plate 240. Specifically, the second parts 242 and 243 of the second plate 240 may project forwards from the second body 241, and may respectively have therein the second upper holes 242b2 and 243b2, through which the second upper fastening elements b7 and b8 respectively extend. The second ends of the upper bodies 231 and 232 may be disposed so as to respectively face the second parts 242 and 243, and may respectively have therein second holes, which respectively communicate with the second upper holes 242b2 and 243b2. The second upper fastening elements b7 and b8, such as bolts, may extend through the second upper holes 242b2 and 243b2 and the second holes 231b and 232b, and may be engaged with elements such as nuts (not shown). Accordingly, the second ends of the upper bodies 231 and 232 may be pivotably coupled to the second parts 242 and 243, respectively. The central axis of the second upper fastening elements b7 and b8 may be coaxial with the second upper pivot shaft. In other words, the second upper fastening elements b7 and b8 may serve as the second upper pivot shaft, and the second ends of the upper bodies 231 and 232 may be rotated about the central axis of the second upper fastening elements b7 and b8.

The first guide portion 244 of the second body 241 may define the boundary of the first slot SL2, and the second guide portion 245 may define the boundary of the second slot SL3. For example, the first guide portion 244 and the second guide portion 245 may be laterally spaced apart from each other, and each of the first guide portion 244 and the second guide portion 245 may be depressed forwards so as to form a stepped portion. As the second plate 240 is moved toward the first support 201, which is fixed to the stationary object W (see FIG. 17) by means of the first fastening element F2, the first neck 2011 of the first support 201 (see FIG. 18) may move along the first slot SL2 relative thereto. As the second plate 240 is moved toward the second support 202, which is fixed to the stationary object W (see FIG. 17) by means of the second fastening element F3, the second neck 2021 of the second support 202 (see FIG. 18) may moved along the second slot SL3 relative thereto. When the first support 201 and the second support 202 are respectively seated in the first slot SL2 and the second slot SL3, the front surfaces of the first guide portion 244 and the second guide portions 245 may be in contact with the rear surface of the first head 2012 of the first support 201 and the rear surface of the second head 2022 of the second support 202. Accordingly, the first support 201 and the second support 202 are capable of supporting the load of the bracket 200 and the display device 1 coupled to the bracket 200.

Figure 21:
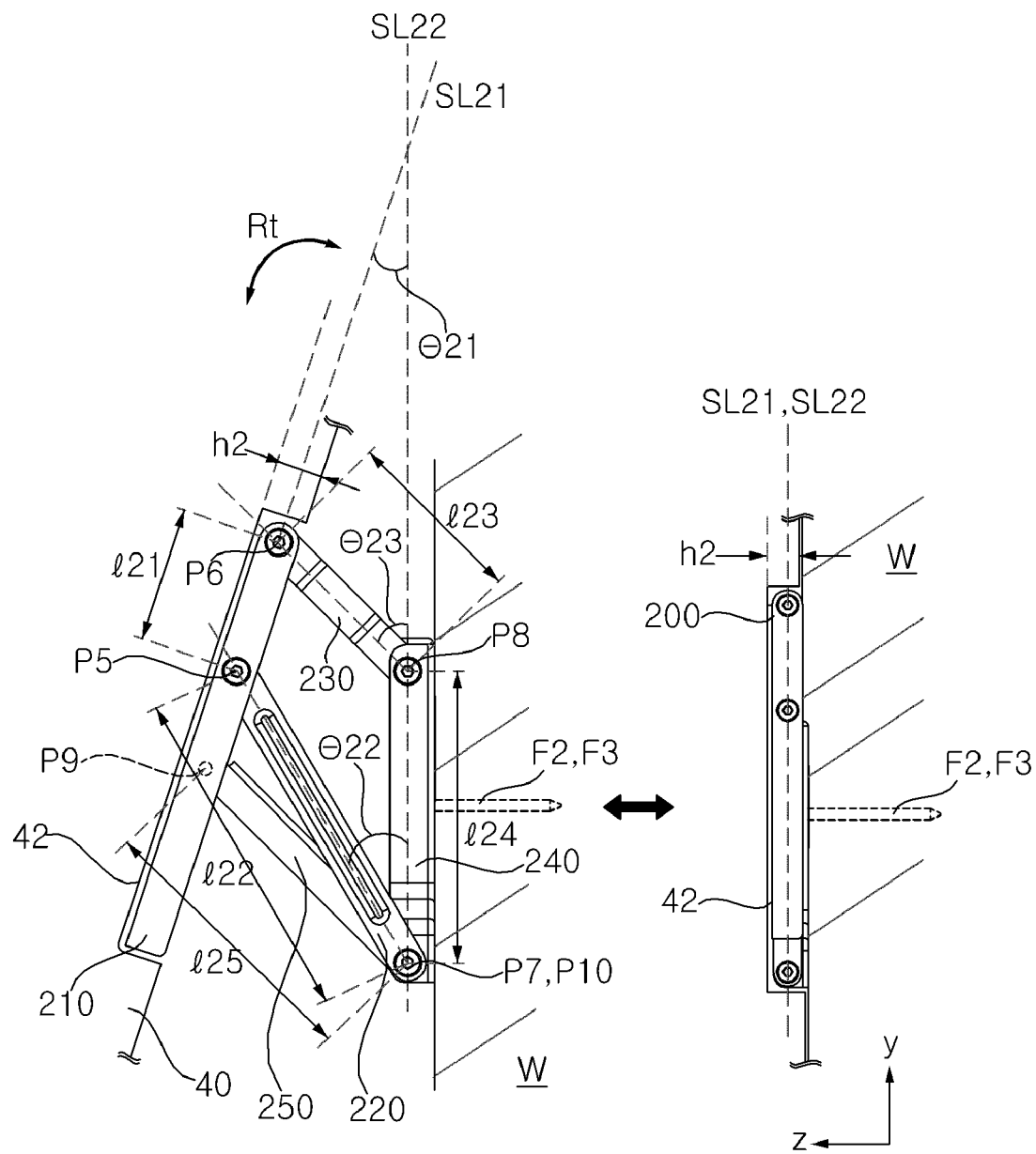

Referring to FIG. 21, the lower link 220 and the upper link 230 may be disposed between the first plate 210 and the second plate 240, and may be pivotably coupled to the first plate 210 and the second plate 240. When the lower link 220 and the upper link 230 are rotated in a first rotational direction (for example, in a counterclockwise direction), the first plate 210 may be moved forwards from the second plate 240 while being inclined. In contrast, when the lower link 220 and the upper link 230 are rotated in the direction opposite the first rotational direction (for example, in a clockwise direction), the first plate 210 may come close to the second plate 240, and may thus be disposed so as to be parallel to the second plate 240.

Here, the first lower pivot shaft is denoted by reference mark P5, the first upper pivot shaft is denoted by reference mark P6, the second lower pivot shaft is denoted by reference mark P7, and the second upper pivot shaft is denoted by reference mark P8.

The first lower pivot shaft P5 may be positioned under the first upper pivot shaft P6, and the second lower pivot shaft P7 may be positioned under the second upper pivot shaft P8. A first length l21, which is the length of the first imaginary line SL21, which extends from the first lower pivot shaft P5 to the first upper pivot shaft P6, may be maintained constant. Furthermore, a second length l24, which is the length of the second imaginary line SL22, which extends from the second lower pivot shaft P7 to the second upper pivot shaft P8, may be maintained constant. Here, the first length l21 may be shorter than the second length l24, and the lower link 220 may be longer than the upper link 230. In other words, the distance l22 between the first lower pivot shaft P5 and the second lower pivot shaft P7 may be longer than the distance l23 between the first upper pivot shaft P6 and the second upper pivot shaft P8.

When the lower link 220 and the upper link 230 are pivoted such that the longitudinal direction of the lower link 220 intersects the longitudinal direction of the upper link 230 (see the left figure in FIG. 21), the extension of the first imaginary line SL21 may intersect the extension of the second imaginary line SL22 with an included angle θ21 defined therebetween. The longitudinal axis of the lower link 220 may be inclined with respect to the second imaginary line SL22 by θ22, and the longitudinal axis of the upper link 230 may be inclined with respect to the second SL22 by θ23, which is larger than θ22. θ21 is an acute angle smaller than θ22. The lower link 220 and the upper link 230 may have different lengths, and the opposite ends of each of the lower link 220 and the upper link 230 serve as fixed ends. Consequently, rotation of the lower link 220 and the upper link 230 in the first rotational direction (for example, in a counterclockwise direction) may be stopped when θ21 becomes a specific angle.

As a result, when θ21 becomes the specific angle, the first plate 210 may be maintained in the state of being spaced apart from the second plate 240 while being inclined. Since the first plate 210 is spaced apart from the second plate 240 forwards when θ21 becomes the specific angle, it is possible for a user to easily recognize the positions of the first and second support 201 and 202 (see FIG. 20) fixed to the stationary object W and the first and second slot SL2 and SL3 (see FIG. 20), thereby improving convenience of installation. Furthermore, since the first plate 210 is maintained in a state of being inclined with respect to the second plate 240 when θ21 becomes the specific angle, it is possible for a user to easily access the rear surface of the back cover 40 in the state in which the back cover 40 is coupled to the stationary object W. Accordingly, it is possible for a user to easily connect or disconnect cables, USB devices or the like to or from various ports provided at the rear surface of the back cover 40.

Figure 22:
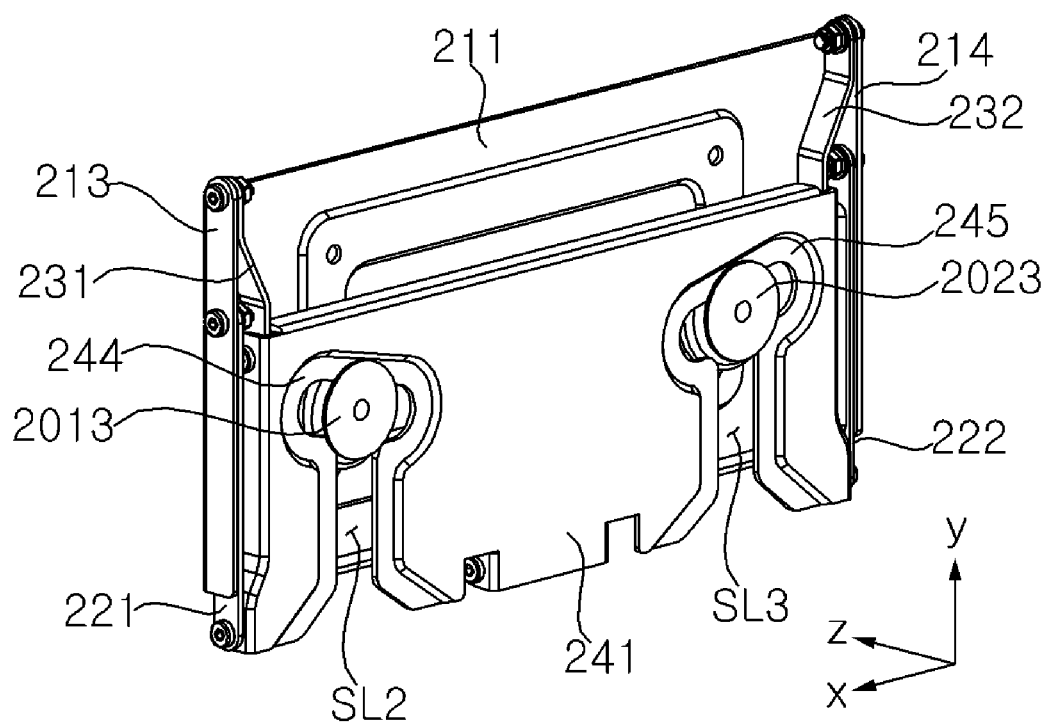

Referring to FIGS. 21 and 22, when the lower link 220 and the upper link 230 are pivoted such that the longitudinal direction of the lower link 220 is parallel to the longitudinal direction of the upper link 230 (see the right figure in FIG. 21), the extension of the first imaginary line SL21 and the extension of the second imaginary line SL22 may be disposed so as to be parallel to each other. For example, the extension of the first imaginary line SL21 and the extension of the second imaginary line SL22 may be disposed so as to be parallel to each other in a vertical direction. In this state, the first plate 210 may surround at least a portion of the second plate 240, and the lower link 220 and the upper link 230 may be disposed so as to be parallel to each other in a vertical direction between the first plate 210 and the second plate 240.

As a result, since the thickness of the bracket 200 in an anteroposterior direction is minimized, the distance between the back cover 40 and the stationary object W may be minimized. Furthermore, the mounting portion 42, in which the first plate 210 of the bracket 200 is fixed, may be depressed from the rear surface of the back cover 40, thereby forming a stepped portion. Here, the depth h2 of the mounting portion 42 in the back cover 40 may be equal to or larger than the thickness of the first plate 210. Consequently, since the rear surface of the second plate 240 is positioned so as to be flush with or to be close to the remaining surface of the back cover 40 other than the mounting portion 42, it is possible to cause the entire area of the back cover 40 to be in close contact with the stationary object W.

Referring again to FIGS. 19 and 21, the links 220, 230 and 250 may include a middle link 250. The middle link 250 may be positioned between the pair of lower bodies 221 and 222. The middle link 250 may extend in a direction intersecting the first plate 210 and the second plate 240, and may be coupled to the first plate 210 and the second plate 240.

Holders 216 and 217 may project rearwards from the first plate 210, and may respectively have first middle holes 216a and 217a therein. Here, the first middle holes 216a and 217a may be formed so as to be parallel to the first imaginary line SL21, which extends from the first lower pivot shaft P5 to the first upper pivot shaft P6. For example, the holders 216 and 217 may include a pair of holders 216 and 217, which are laterally spaced apart from each other.

The middle link 250 may include middle bodies 252 and 253, a middle rotational shaft, a middle pivot shaft, a rod 254 and rings 255. The middle bodies 252 and 253 may extend in the longitudinal direction of the middle link 250, that is, in a direction intersecting the first plate 210 and the second plate 240. For example, each of the middle bodies 252 and 253 may be configured to have a rectangular beam shape overall.

For example, the middle bodies 252 and 253 may include a pair of bodies 252 and 253, which are laterally spaced apart from each other. The middle link 250 may include a middle plate 251, which is positioned between the pair of middle bodies 252 and 253 and which connects the pair of middle bodies 252 and 253 to each other.

The middle rotational shaft may extend in a direction intersecting the longitudinal direction of the middle bodies 252 and 253, at first ends of the middle bodies 252 and 253, and may be coupled to the holders 216 and 217. Specifically, the first ends of the middle bodies 252 and 253 may be disposed so as to respectively face the holders 216 and 217, and may respectively have therein first holes 252a and 253a, which respectively communicate with the first middle holes 216a and 217a. The rod, which extends laterally, may extend through the first holes 252a and 253a and the first middle holes 216a and 217a, and may be provided at opposite ends thereof with the rings 255 coupled thereto so as to prevent the rod 254 from being separated from the holders 216 and 217. Each of the rings 255 may have a larger diameter than that of each of the middle holes 216a and 217a, and may be partially cut out so as to have an "E" shape overall. Here, each of the rings 255 may be referred to as an E-ring. Consequently, the first ends of the middle bodies 252 and 253 may be rotatably and movably coupled to the holders 216 and 217, respectively. The central axis of the rod 254 may be coaxial with the middle rotational shaft. In other words, the rod 254 may serve as the middle rotational shaft, and the first end of the middle bodies 252 and 253 may be rotated about the central axis of the rod 254, and may be moved along the longitudinal direction of the first middle holes 216a and 217a together with the rod 254.

The middle pivot shaft may extend in a direction parallel to the middle rotational shaft at second ends of the middle bodies 252 and 253, and may be coupled to the second plate 240. Specifically, the second plate 240 may include third parts 246 and 247, which project forwards from the lower side of the second body 241 and which respectively have therein second middle holes 246b and 247b (not shown), through which middle fastening elements b9 and b10 respectively extend. The second ends of the middle bodies 252 and 253 may be disposed so as to respectively face the third parts 246 and 247, and may respectively have therein second holes 252b and 253b, which respectively communicate with the second middle holes 246b and 247b. The middle fastening elements b9 and b10, such as bolts, may respectively extend through the second middle holes 246b and 247b and the second holes 252b and 253b, and may be engaged with elements such as nuts (not shown). Accordingly, the second ends of the middle bodies 252 and 253 may be pivotably coupled to the third parts 246 and 247, respectively. The central axis of the middle fastening elements b9 and b10 may be coaxial with the middle pivot shaft. In other words, the middle fastening elements b9 and b10 may serve as the middle pivot shaft, and the second ends of the middle bodies 252 and 253 may be rotated about the central axis of the middle fastening elements b9 and b10.

Here, the middle rotational shaft is denoted by reference mark P9, and the middle pivot shaft is denoted by reference mark P10. The middle rotational shaft P9 may be positioned under the first lower pivot shaft P5. The middle pivot shaft P10 and the second lower pivot shaft P7 may be coaxial with each other. The distance l25 between the middle rotational shaft P9 and the middle pivot shaft P10 may be shorter than the distance l22 between the first lower pivot shaft P5 and the second lower pivot shaft P7.

Accordingly, the middle link 250 may connect the first plate 210 to the second plate 240 together with the lower link 220 and the upper link 230 in order to ensure the tilting movement of the first plate 210 with respect to the second plate 240 and to increase the binding force between the first plate 210 and the second plate 240. Consequently, the display device 1 is capable of being stably installed on the stationary object W by virtue of the bracket 200 including the middle link 250.

Figure 23:
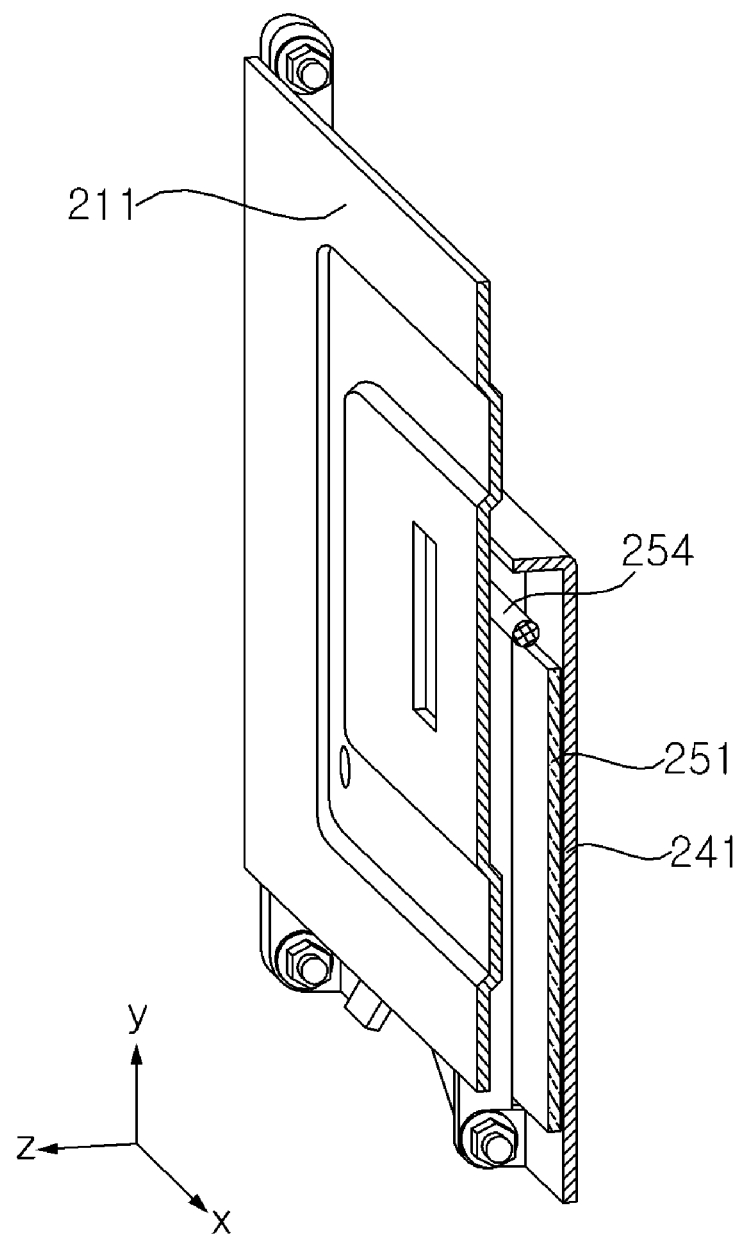
Figure 24:
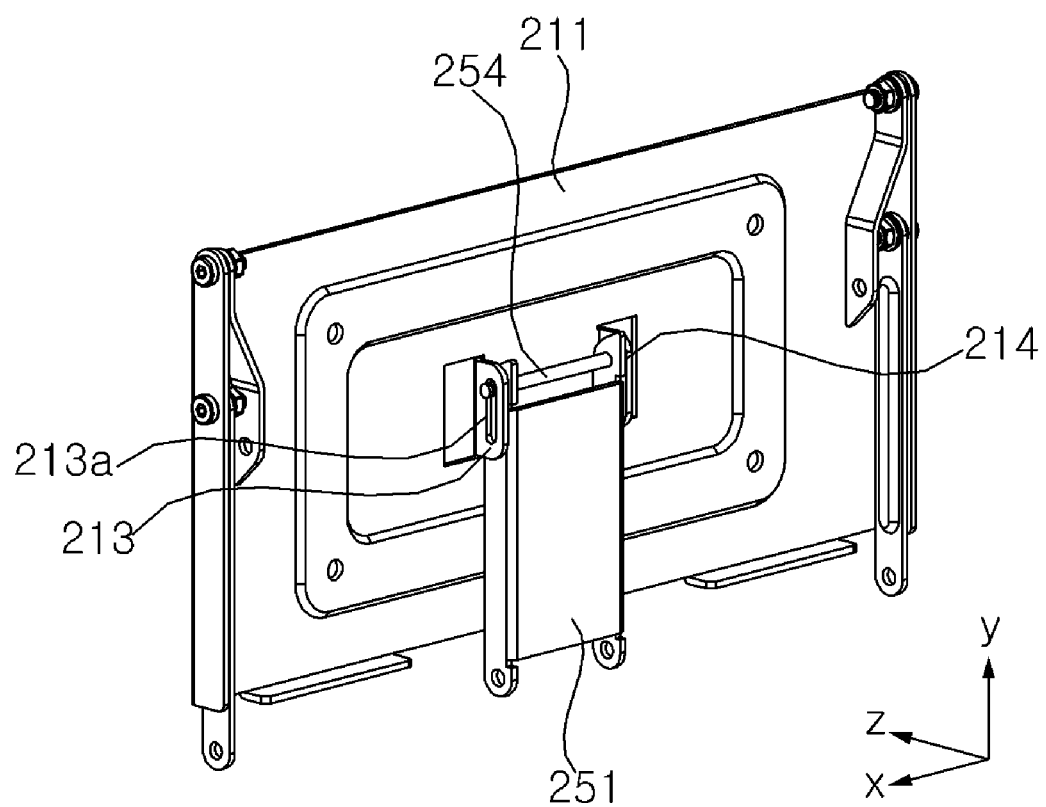

Referring to FIGS. 23 and 24, when the thickness of the bracket 200 is minimized (see the right figure in FIG. 21), the middle plate 251 may be disposed so as to be parallel to the vertical direction. In other words, when the first body 211 of the first plate 210 and the second body 241 of the second plate 240 are disposed so as to be parallel to the vertical direction, the rod 254 may be positioned at or adjacent to the upper ends of the first middle holes 216a and 217a (see FIG. 19). Meanwhile, when the first plate 210 is in a state of being tilted with respect to the second plate 240 (see the left figure in FIG. 21), the rod 254 may be positioned at or adjacent to the lower ends of the first middle holes 216a and 217a (see FIG. 19).

When the thickness of the bracket 200 is minimized (see the right figure in FIG. 21), the holders 216 and 217 and/or the middle plate 251 may be in contact with the second body 241.

Figure 25:
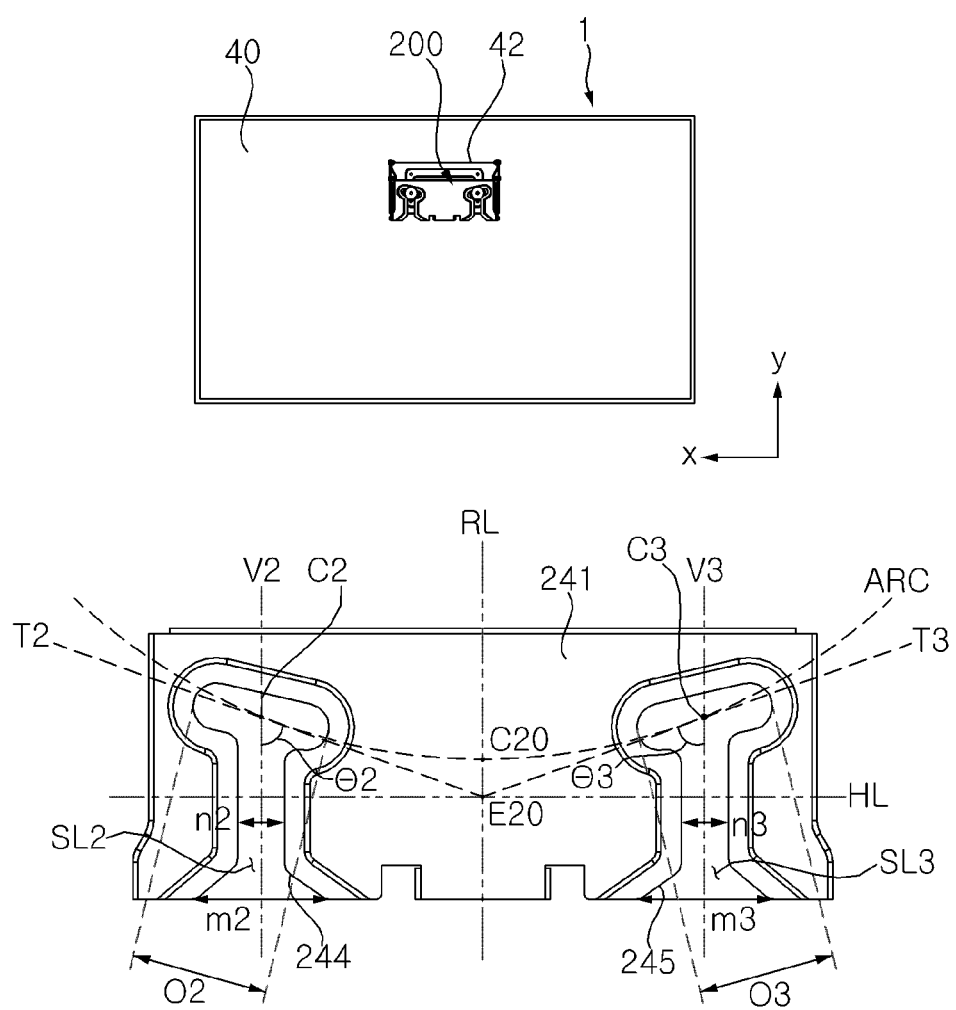

Referring to FIG. 25, the bracket 200 may be fixed to the mounting portion 42, adjacent to the center of the upper end of the back cover 40. At this point, the first slot SL2 and the second slot SL3 in the bracket 200 may be bilaterally symmetrical with each other.

The first slot SL2 may be formed upwards from the lower side of the second body 241 adjacent to the left side of the second body 241. The first slot SL2 may be sectionally divided into a first entry path, a first link path and a first seating path. The width of the first entry path may be m2 at the lower end thereof, and may be reduced moving upwards. The first link path may be connected to the upper end of the first entry path, and the width of the first link path may be n2, which is equal to the width of the upper end of the first entry path and may be constant in a vertical direction. The first seating path may be connected to the upper end of the first link path, and may be formed in a direction intersecting the first imaginary vertical line V2, which extends vertically through the center C2 of the first seating path. The width of the first seating path in the direction in which the first seating path is formed may be O1a. Here, any of the width of the first entry path, the width of the first link path and the width of the first seating path may be larger than the diameter of the neck 2011 of the first support 201 (see FIG. 18).

Accordingly, the first support 201 (see FIG. 17), which is fixed to the stationary object W, may easily enter the first entry path having a relatively large width, and may be guided into the first seating path along the first link path by means of the first guide portion 244, which defines the boundary of the first slot SL2. When the first support 201 is seated on the first seating path, the front surface of the first guide portion 244 comes into contact with the first head 2012, and the first support 201 is thus capable of supporting the load of the bracket 200 and the display device 1 coupled to the bracket 200.

The second slot SL3 may be formed upwards from the lower side of the second body 241 of the bracket 200. The second slot SL3 may be sectionally divided into a second entry path, a second link path and a second seating path. The width of the second entry path may be m3 at the lower end thereof, and may be reduced moving upwards. The second link path may be connected to the upper end of the second entry path, and the width of the second link path may be n3, which is equal to the width of the upper end of the second entry path, and may be constant in a vertical direction. The second seating path may be connected to the upper end of the second link path, and may be formed in a direction intersecting the right imaginary vertical line V3, which extends vertically through the center C3 of the second seating path. The width of the second seating path in the direction in which the second seating path is formed may be O3. Here, any of the width of the second entry path, the width of the second link path and the width of the second seating path may be larger than the diameter of the neck 2011 of the second support 201 (see FIG. 18).

Accordingly, the second support 202 (see FIG. 17), which is fixed to the stationary object W, may easily enter the second entry path having a relatively large width, and may be guided into the second seating path along the second link path by means of the second guide portion 245, which defines the boundary of the second slot SL3. When the second support 202 is seated on the second seating path, the front surface of the second guide portion 245 comes into contact with the head 2012, and the second support 202 is thus capable of supporting the load of the bracket 200 and the display device 1 coupled to the bracket 200.

The first slot SL2 and the second slot SL3 may be bilaterally symmetrical. Specifically, the width m2 of the lower end of the first entry path may be equal to the width m3 of the lower end of the second entry path, and the width n2 of the first link path may be equal to the width n3 of the second link path. The center C2 of the first seating path and the center C3 of the second seating path may be located on an imaginary arc. Here, the imaginary arc may intersect the vertical line RL at the center point C20.

Here, the first tangent line T2 to the imaginary arc may extend through the center C2 of the first seating path and may be tangent to the arc. The second tangent line T3 may extend through the center C3 of the second seating path and may be tangent to the arc. The first tangent line T2 and the second tangent line T3 may intersect the cross point E20 on the vertical line RL, and the cross point E20 may be located under the center point C20 of the arc. In other words, the first tangent line T2 may extend to the cross point E20, and may define a predetermined angle θ2 with respect to the first vertical line V2. The second tangent line T3 may extend to the cross point E20, and may define a predetermined angle θ3 with respect to the second vertical line V3. Here, the predetermined angles θ2 and θ3 may be equal to each other, and may each be an acute angle.

For example, the first seating path may be formed along the first tangent line T2, and the second seating path may be formed along the second tangent line T3. In other words, the first seating path and the second seating path may be bilaterally symmetrical. Consequently, when the first support 201 and the second support 201 seat on the first seating path and the second seating path, respectively, the bracket 200 and the display device 1 coupled to the bracket 200 may be maintained in a certain position, as long as no external force is applied to the bracket 200.

Figure 26:
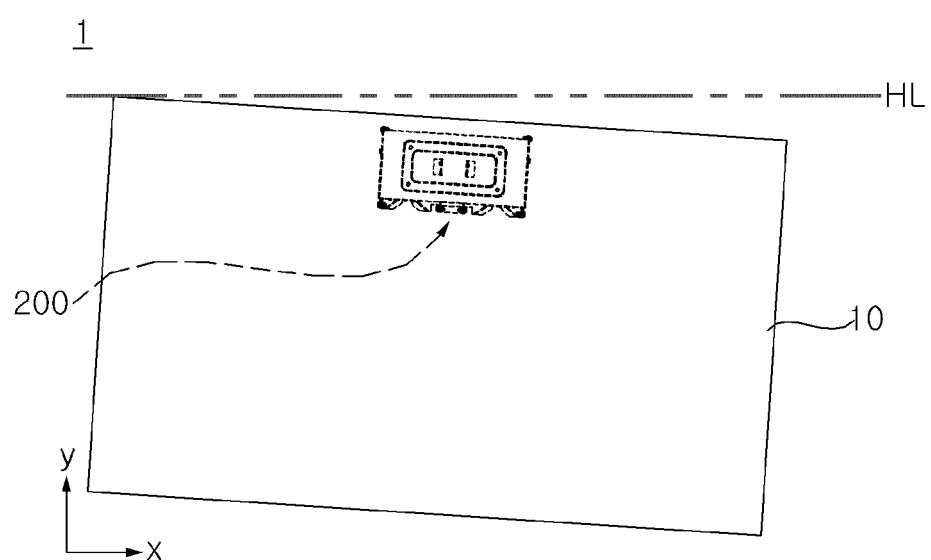
Figure 27:
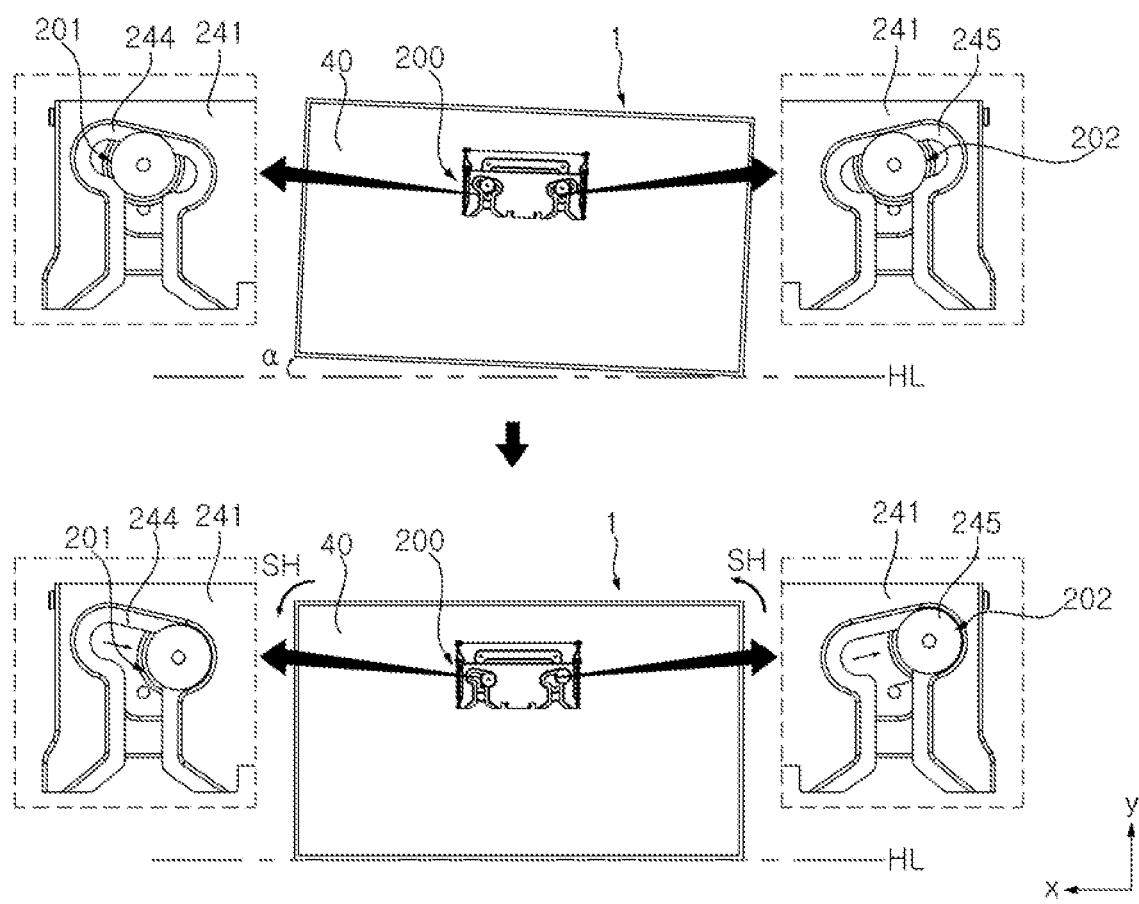
Figure 28:
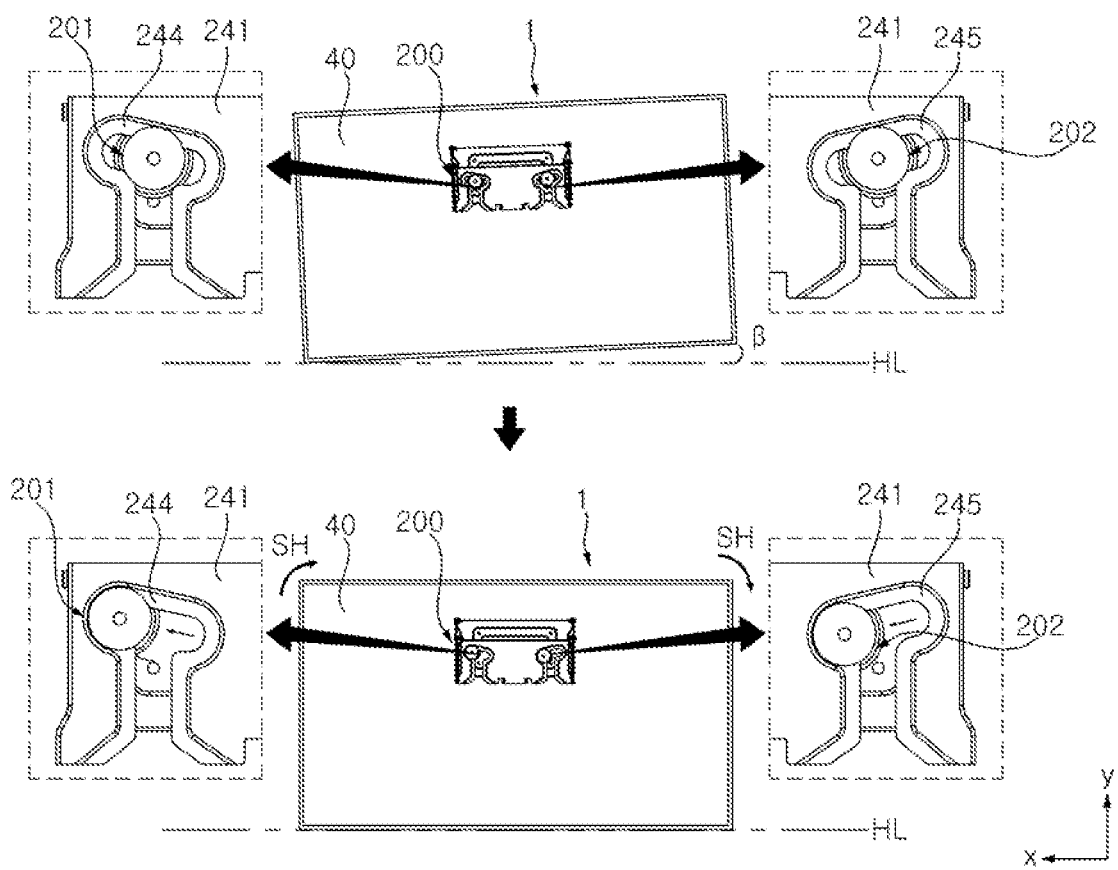

Referring to FIGS. 26 to 28, the display device 1 may be installed on the stationary object W (see FIG. 17) by means of the bracket 200, and may thus be maintained in the immobile state.

Referring to FIG. 26, the bracket 200 may be out of alignment with the horizontal line HL, and the display device 1 may thus be maintained in a non-horizontal position and in an immobile state.

Referring to FIGS. 27 and 28, when an external force is applied to the bracket 200, the first and second supports 201 and 202 may move in the first seating path and the second seating path, respectively, thereby making it possible to adjust the slope of the display device 1 with respect to the horizontal line HL.

For example, the bracket 200 and the left part of the display device 1 coupled to the bracket 200 may be inclined upwards with respect to the horizontal line HL by a predetermined angle α (see the upper figure in FIG. 27). A user is able to adjust the position of the display device 1 to be horizontal through an action of shifting (SH) the right part of the display device 1 upwards while shifting (SH) the left part of the display device 1 downwards (see the lower figure in FIG. 27). At this point, the first support 201 may be lowered while being moved rightwards on the first seating path, and the second support 202 may be raised while being moved rightwards on the second seating path.

Meanwhile, the bracket 200 and the right part of the display device 1 coupled to the bracket 200 may be inclined with respect to the horizontal line HL by a predetermined angle β (see the upper figure in FIG. 28). A user is able to adjust the position of the display device 1 to be horizontal through an action of shifting (SH) the left part of the display device 1 upwards while shifting (SH) the right part of the display device 1 downwards (see the lower figure in FIG. 28). At this point, the left support 201 may be raised while being moved leftwards on the first seating path, and the second support 202 may be lowered while being moved leftwards on the second seating path.

In accordance with an aspect of the present disclosure, there is provided a bracket including a first plate, a second plate disposed so as to face the first plate, and a link disposed between the first plate and the second plate so as to connect the first plate to the second plate, wherein the second plate includes therein a slot, which is formed toward an inside from a lower side of the second plate, wherein the link includes a lower link, and an upper link disposed above the lower link, and wherein each of the lower link and the upper link extends in a direction intersecting the first plate and the second plate, and is pivotably coupled both to the first plate and to the second plate.

In accordance with another aspect of the present disclosure, the lower link may further include a lower body extending in the longitudinal direction of the lower link, a first lower pivot shaft, which extends in a direction intersecting a longitudinal direction of the lower body, at a first end of the lower body, and which is coupled to the first plate, and a second lower pivot shaft, which extends in a direction parallel to the first lower pivot shaft at a second end of the lower body and which is coupled to the second plate, and the upper link may further include an upper body extending in a longitudinal direction of the upper link, a first upper pivot shaft, which extends in a direction intersecting a longitudinal direction of the upper body, at a first end of the upper body, and which is coupled to the first plate, and a second upper pivot shaft, which extends in a direction parallel to the first upper pivot shaft at a second end of the upper body and which is coupled to the second plate.

In accordance with another aspect of the present disclosure, the first lower pivot shaft may be positioned under the first upper pivot shaft, and the second lower pivot shaft may be positioned under the second upper pivot shaft.

In accordance with another aspect of the present disclosure, a first length, which is a length of a first imaginary line, which extends from the first lower pivot shaft to the first upper pivot shaft, may be maintained constant, and a second length, which is a length of a second imaginary line, which extends from the second lower pivot shaft to the second upper pivot shaft, may be maintained constant.

In accordance with another aspect of the present disclosure, when the lower link and the upper link are pivoted such that the longitudinal direction of the lower body and the longitudinal direction of the upper body are parallel to each other, the first imaginary line and the second imaginary line may be parallel to each other.

In accordance with another aspect of the present disclosure, the lower body may have a greater length than a length of the upper body, and the first length may be less than the second length, such that, when the lower link and the upper link are pivoted so that the longitudinal direction of the lower body intersects the longitudinal direction of the upper body, the first imaginary line may intersect the second imaginary line with an acute angle defined therebetween.

In accordance with another aspect of the present disclosure, the lower body may further include a pair of lower bodies, which are laterally spaced apart from each other, and the upper body may further include a pair of upper bodies, which are laterally spaced apart from each other.

In accordance with another aspect of the present disclosure, the lower link may further include a lower plate, which is positioned between the pair of lower bodies so as to connect the pair of lower bodies to each other and which includes a lower reinforcing portion, which is depressed inwards from the lower plate, and the upper link may further include an upper plate, which is positioned between the pair of upper bodies so as to connect the pair of upper bodies to each other and which includes an upper reinforcing portion, which is depressed inwards from the upper plate.

In accordance with another aspect of the present disclosure, the bracket may further include a magnet, which is positioned between the first plate and the second plate, is fixed to the first plate, and is magnetically coupled to the second plate.

In accordance with another aspect of the present disclosure, the link may further include a middle link, which is rotatably and movably coupled at a first end thereof to the first plate and which is pivotably coupled at a second end thereof to the second plate, and the middle link being positioned between the pair of lower bodies.

In accordance with another aspect of the present disclosure, the first plate may further include a holder, which projects rearwards from the first plate and has therein a hole, and the middle link may further include a middle body extending long, a middle rotational shaft, which extends in a direction intersecting a longitudinal direction of the middle body, at a first end of the middle body, and which is coupled to the holder, a middle pivot shaft, which extends in a direction parallel to the middle rotational shaft at a second end of the middle body and which is coupled to the second plate, and a rod, which serves as the middle rotational shaft and which is inserted into the hole, wherein the hole extends in a direction parallel to a first imaginary line, which extends from the first lower pivot shaft to the first upper pivot shaft, and wherein the rod is rotatable about an axis of the middle rotational shaft and is movable in a longitudinal direction of the hole.

In accordance with another aspect of the present disclosure, the middle rotational shaft may be positioned under the first lower pivot shaft, and the middle pivot shaft and the second lower pivot shaft may be coaxial with each other.

In accordance with another aspect of the present disclosure, there is provided a display device including a display panel, a back cover covering a rear surface of the display panel, a bracket disposed behind the back cover and coupled to the back cover, and a support disposed behind the back cover and removably coupled to the bracket, wherein the bracket includes a first plate, a second plate disposed so as to face the first plate, and a link disposed between the first plate and the second plate so as to connect the first plate to the second plate, wherein the second plate includes therein a slot, which is formed toward an inside from a lower side of the second plate and in which the support is movably received, wherein the link includes a lower link, and an upper link disposed above the lower link, wherein each of the lower link and the upper link extends in a direction intersecting the first plate and the second plate and is pivotably coupled both to the first plate and to the second plate.

In accordance with another aspect of the present disclosure, the back cover may include a mounting portion, which is depressed from a rear surface of the back cover so as to form a stepped portion and to which the first plate is coupled, and the mounting portion having a depth equal to or larger than a thickness of the first plate.

In accordance with another aspect of the present disclosure, the support may further include a head disposed between the first plate and the second plate so as to be in contact with the second plate; and a neck projecting from the head and extending through the slot, and the slot may have a width greater than a diameter of the neck but smaller than a diameter of the head.

As is apparent from the above description, at least one embodiment of the present disclosure provides a display device, which is capable of being installed on a stationary object, such as a wall, by means of a bracket coupled to a back cover of the display device and a support fixed to the stationary object.

At least one embodiment of the present disclosure provides a display device, in which a first plate of a bracket is capable of being tilted with respect to a second plate of the bracket, thereby allowing a user to easily access the rear side of a back cover of the display device.

At least one embodiment of the present disclosure provides a display device, in which a first plate of a bracket is constructed so as to surround a second plate of the bracket and to be parallel to the second plate, thereby minimizing the distance between a back cover of the display device and a stationary object.

Certain embodiments or other embodiments of the disclosure described above are not mutually exclusive or distinct from each other. Any or all elements of the embodiments of the disclosure described above may be combined with each other in configuration or function.

For example, a configuration "A" described in one embodiment of the disclosure and the drawings and a configuration "B" described in another embodiment of the disclosure and the drawings may be combined with each other. That is, even if the combination between the configurations is not directly described, the combination is possible except in the case where it is described that the combination is impossible.

Although embodiments have been described with reference to a number of illustrative embodiments thereof, it should be understood that numerous other modifications and embodiments that fall within the scope of the principles of this disclosure can be devised by those skilled in the art. More particularly, various variations and modifications are possible in the component parts and/or arrangements within the scope of the disclosure, the drawings and the appended claims. In addition to variations and modifications in the component parts and/or arrangements, alternative uses will also be apparent to those skilled in the art.

What is claimed is:

1. A bracket comprising:
a first plate;
a second plate disposed so as to face the first plate; and
a link disposed between the first plate and the second plate so as to connect the first plate to the second plate,
wherein the second plate comprises therein a slot, which is formed toward an inside from a lower side of the second plate,
wherein the link comprises:
a lower link; and
an upper link disposed above the lower link,
wherein each of the lower link and the upper link extends in a direction intersecting the first plate and the second plate, and is pivotably coupled both to the first plate and to the second plate,
wherein the lower link further comprises:
a lower body extending in a longitudinal direction of the lower link;
a first lower pivot shaft, which extends in a direction intersecting a longitudinal direction of the lower body, at a first end of the lower body, and which is coupled to the first plate; and
a second lower pivot shaft, which extends in a direction parallel to the first lower pivot shaft at a second end of the lower body and which is coupled to the second plate, and
wherein the upper link further comprises:
an upper body extending in a longitudinal direction of the upper link;
a first upper pivot shaft, which extends in a direction intersecting a longitudinal direction of the upper body, at a first end of the upper body, and which is coupled to the first plate; and
a second upper pivot shaft, which extends in a direction parallel to the first upper pivot shaft at a second end of the upper body and which is coupled to the second plate.

2. A display device comprising:
a display panel;
a back cover covering a rear surface of the display panel;
a bracket disposed behind the back cover and coupled to the back cover; and
a support disposed behind the back cover and removably coupled to the bracket,
wherein the bracket comprises:
a first plate;
a second plate disposed so as to face the first plate; and
a link disposed between the first plate and the second plate so as to connect the first plate to the second plate,
wherein the second plate comprises therein a slot, which is formed toward an inside from a lower side of the second plate and in which the support is movably received,
wherein the link comprises:
a lower link; and
an upper link disposed above the lower link, and
wherein each of the lower link and the upper link extends in a direction intersecting the first plate and the second plate, and is pivotably coupled both to the first plate and to the second plate.

3. The display device according to claim 2, wherein the lower link further comprises:
a lower body extending in a longitudinal direction of the lower link;
a first lower pivot shaft, which extends in a direction intersecting a longitudinal direction of the lower body, at a first end of the lower body, and which is coupled to the first plate; and
a second lower pivot shaft, which extends in a direction parallel to the first lower pivot shaft at a second end of the lower body and which is coupled to the second plate, and
wherein the upper link further comprises:
an upper body extending in a longitudinal direction of the upper link;
a first upper pivot shaft, which extends in a direction intersecting a longitudinal direction of the upper body, at a first end of the upper body, and which is coupled to the first plate; and
a second upper pivot shaft, which extends in a direction parallel to the first upper pivot shaft at a second end of the upper body and which is coupled to the second plate.

4. The display device according to claim 3, wherein the first lower pivot shaft is positioned under the first upper pivot shaft, and the second lower pivot shaft is positioned under the second upper pivot shaft.

5. The display device according to claim 4, wherein a first length, which is a length of a first imaginary line, which extends from the first lower pivot shaft to the first upper pivot shaft, is maintained constant, and
wherein a second length, which is a length of a second imaginary line, which extends from the second lower pivot shaft to the second upper pivot shaft, is maintained constant.

6. The display device according to claim 5, wherein, when the lower link and the upper link are pivoted such that the longitudinal direction of the lower body and the longitudinal direction of the upper body are parallel to each other, the first imaginary line and the second imaginary line are parallel to each other.

7. The display device according to claim 6, wherein the lower body has a greater length than a length of the upper body,
wherein the first length is less than the second length, and
wherein, when the lower link and the upper link are pivoted such that the longitudinal direction of the lower body intersects the longitudinal direction of the upper body, the first imaginary line intersects the second imaginary line with an acute angle defined therebetween.

8. The display device according to claim 3, wherein the lower body further comprises a pair of lower bodies, which are laterally spaced apart from each other, and
wherein the upper body further comprises a pair of upper bodies, which are laterally spaced apart from each other.

9. The display device according to claim 8, wherein the lower link further comprises a lower plate, which is positioned between the pair of lower bodies so as to connect the pair of lower bodies to each other, and which includes a lower reinforcing portion, which is depressed inwards from the lower plate, and
wherein the upper link further comprises an upper plate, which is positioned between the pair of upper bodies so as to connect the pair of upper bodies to each other, and which includes an upper reinforcing portion, which is depressed inwards from the upper plate.

10. The display device according to claim 8, further comprising a magnet, which is positioned between the first plate and the second plate, is fixed to the first plate, and is magnetically coupled to the second plate.

11. The display device according to claim 8, wherein the link further comprises a middle link, which is rotatably and movably coupled at a first end thereof to the first plate and which is pivotably coupled at a second end thereof to the second plate, and
wherein the middle link being positioned between the pair of lower bodies.

12. The display device according to claim 11, wherein the first plate further comprises a holder, which projects rearwards from the first plate and has therein a hole,
wherein the middle link further comprises:
a middle body extending long;
a middle rotational shaft, which extends in a direction intersecting a longitudinal direction of the middle body, at a first end of the middle body, and which is coupled to the holder;
a middle pivot shaft, which extends in a direction parallel to the middle rotational shaft at a second end of the middle body and which is coupled to the second plate; and
a rod, which serves as the middle rotational shaft and which is inserted into the hole,
wherein the hole extends in a direction parallel to a first imaginary line, which extends from the first lower pivot shaft to the first upper pivot shaft, and
wherein the rod is rotatable about an axis of the middle rotational shaft and is movable in a longitudinal direction of the hole.

13. The display device according to claim 12, wherein the middle rotational shaft is positioned under the first lower pivot shaft, and the middle pivot shaft and the second lower pivot shaft are coaxial with each other.

14. The display device according to claim 2, wherein the back cover comprises a mounting portion, which is depressed from a rear surface of the back cover so as to form a stepped portion and to which the first plate is coupled, and
wherein the mounting portion having a depth equal to or larger than a thickness of the first plate.

15. The display device according to claim 2, wherein the support further comprises:
a head, disposed between the first plate and the second plate so as to be in contact with the second plate; and
a neck, projecting from the head and extending through the slot, and
wherein the slot has a width greater than a diameter of the neck but smaller than a diameter of the head.

* * * * *